United States Patent
Sogard et al.

(10) Patent No.: US 6,903,346 B2
(45) Date of Patent: Jun. 7, 2005

(54) STAGE ASSEMBLY HAVING A FOLLOWER ASSEMBLY

(75) Inventors: Michael R. Sogard, Menlo Park, CA (US); Michael Kovalerchik, Castro Valley, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 361 days.

(21) Appl. No.: 09/903,307

(22) Filed: Jul. 11, 2001

(65) Prior Publication Data

US 2003/0010935 A1 Jan. 16, 2003

(51) Int. Cl.$^7$ ................................................ G21K 5/10
(52) U.S. Cl. ............... 250/442.11; 250/548; 250/492.21
(58) Field of Search ...................... 356/500; 250/442.11, 250/548, 492.21, 441.11; 108/40, 41, 68, 78, 143; 74/990.09; 248/657; 310/12

(56) References Cited

U.S. PATENT DOCUMENTS

| | | | |
|---|---|---|---|
| 3,652,148 A | 3/1972 | George ........................ 350/86 |
| 4,120,210 A | * 10/1978 | Sloyan ................. 74/242.13 R |
| 4,538,885 A | 9/1985 | Graham et al. ............. 350/529 |
| 4,684,315 A | * 8/1987 | Sughishima et al. ........ 414/749 |
| 4,979,195 A | 12/1990 | Tabata et al. .................. 378/34 |
| 5,073,912 A | 12/1991 | Kobayashi et al. ............ 378/34 |
| 5,120,034 A | 6/1992 | Van Engelen et al. ........ 269/73 |
| 5,214,290 A | * 5/1993 | Sakai ...................... 250/492.2 |
| 5,552,888 A | * 9/1996 | Sogard et al. .............. 356/500 |
| 5,623,853 A | 4/1997 | Novak et al. ............ 74/490.09 |
| 5,877,845 A | 3/1999 | Makinouchi ................. 355/53 |
| 5,969,441 A | * 10/1999 | Loopstra et al. .............. 310/12 |
| 6,008,500 A | * 12/1999 | Lee ............................. 250/548 |
| 6,130,517 A | 10/2000 | Yuan et al. ................. 318/640 |
| 6,281,655 B1 | 8/2001 | Poon et al. ................. 318/649 |

\* cited by examiner

*Primary Examiner*—Hai Pham
*Assistant Examiner*—Lam Nguyen
(74) *Attorney, Agent, or Firm*—Jim Rose; Steven G. Roeder

(57) ABSTRACT

A stage assembly (10) for moving and positioning a device (26) includes a device stage (14), a stage mover assembly (16), and a follower assembly (18). The stage mover assembly (16) moves the device stage (14) along an X axis, along a Y axis and about a Z axis. The follower assembly (18) includes a first follower guide (76) and a first follower frame (80). The first follower guide (76) supports the first follower frame (80) and allows the first follower frame (80) to move along the Y axis. Further, the first follower frame (80) supports the device stage (14) and allows the device stage (14) to move along the Y axis, along the X axis, and about the Z axis. Importantly, the first follower frame (80) is moved along the Y axis with a first follower mover (84). With this design, the device stage (14) can be made relatively thin vertically and the control lines (20) to the device stage (14) can be relatively short.

75 Claims, 16 Drawing Sheets

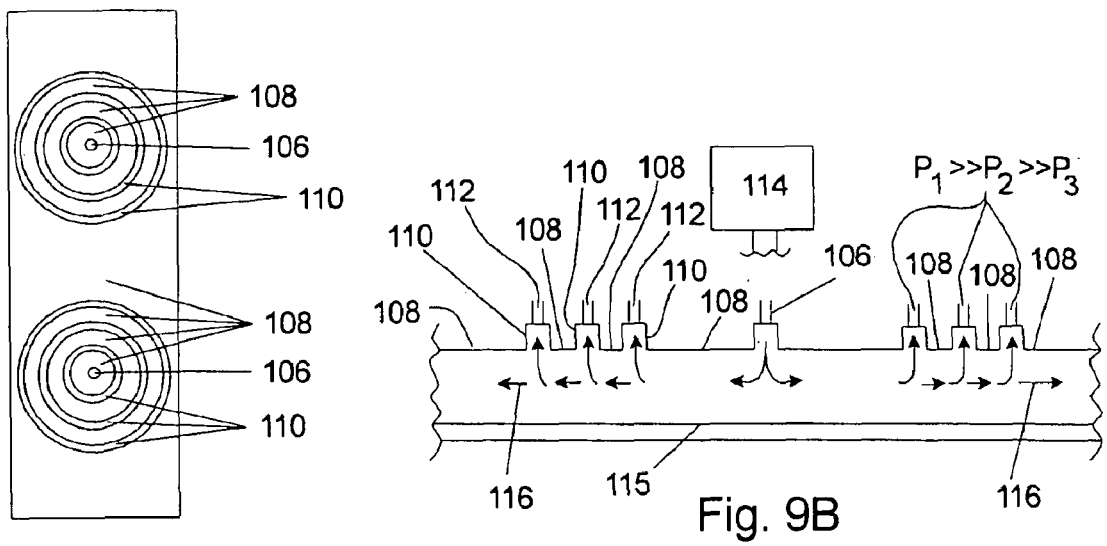
Fig. 9A
Fig. 9B
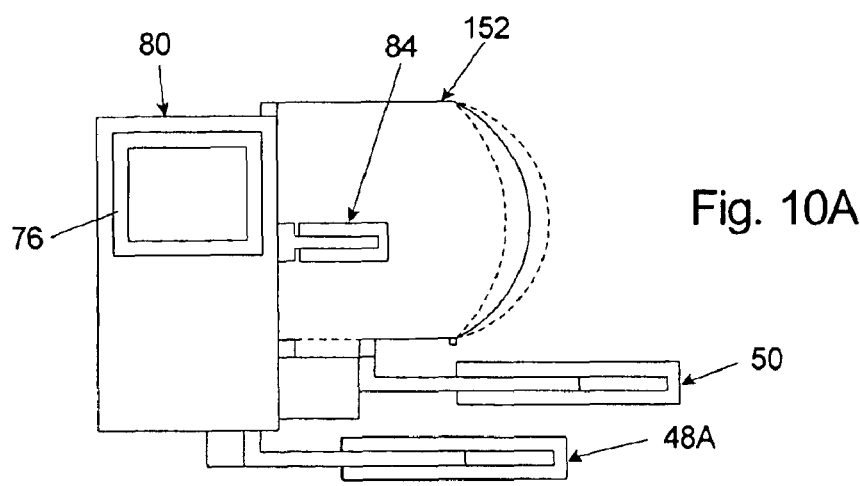
Fig. 10A
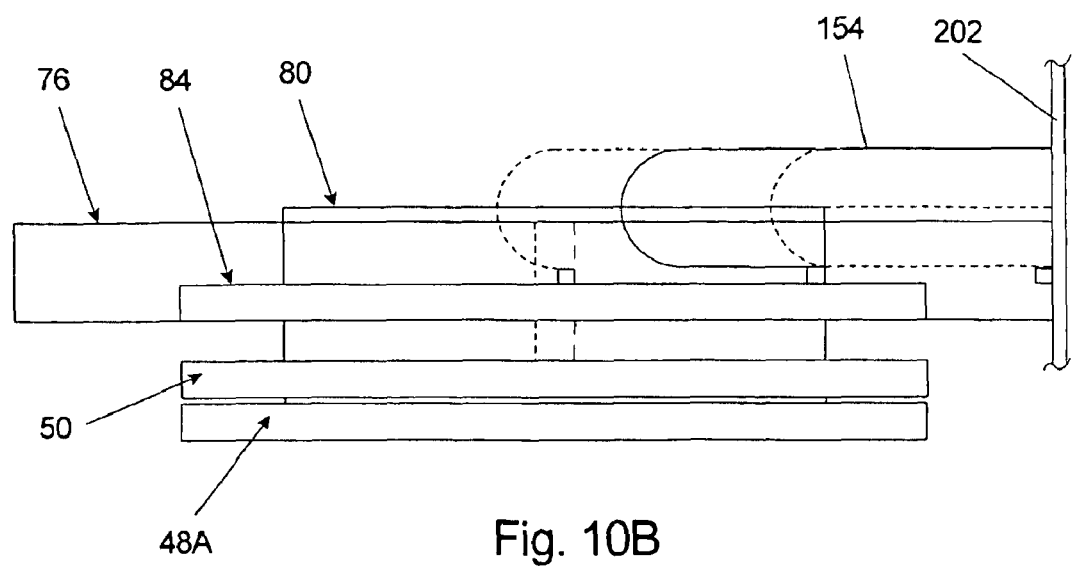
Fig. 10B

STAGE ASSEMBLY HAVING A FOLLOWER ASSEMBLY

FIELD OF THE INVENTION

The present invention is directed to a stage assembly for moving a device. More specifically, the present invention is directed to a stage assembly including a follower assembly for an exposure apparatus. The stage assembly is particularly useful for moving a stage in charged particle lithography, inspection and/or measurement tools.

BACKGROUND

Exposure apparatuses are commonly used to transfer images from a reticle onto a semiconductor wafer during semiconductor processing. A typical exposure apparatus includes an illumination system, a reticle stage assembly that retains a reticle, a projection optical assembly and a wafer stage assembly that retains a semiconductor wafer. The illumination system includes an illumination source and an illumination optical assembly. The reticle stage assembly and the wafer stage assembly are supported above a ground with an apparatus frame.

Typically, the wafer stage assembly includes a wafer stage base, a wafer stage that retains the wafer, and a wafer stage mover assembly that precisely positions the wafer stage and the wafer below the projection optical assembly. Somewhat similarly, the reticle stage assembly includes a reticle stage base, a reticle stage that retains the reticle, and a reticle stage mover assembly that precisely positions the reticle stage and the reticle between the illumination optical assembly and the projection optical assembly. The size of the images and features within the images transferred onto the wafer from the reticle are extremely small. Accordingly, the precise positioning of the wafer and the reticle relative to the lens assembly is critical to the manufacture of high density, semiconductor wafers.

Depending upon the type of energy beam generated by the illumination source, the type of fluid surrounding the reticle and the wafer can influence the performance of the exposure apparatus. For example, some types of beams, e.g. electron beams and very short wavelengths of ultraviolet light, are absorbed by oxygen and other gases. Thus, the environment surrounding the reticle and wafer can influence the performance of the exposure apparatus and the quality of the integrated circuits formed on the wafer can be compromised. As a result thereof, the performance of the exposure apparatus and the quality of the integrated circuits formed on the wafer can be enhanced by controlling the environment around one or both stages.

One way to control the environment around a stage is to position a chamber around the stage. Subsequently, the desired environment can be created within the chamber around the stage. For example, for some processes, the chamber may be filled with an inert fluid. Alternately, electron beam processes function best when the controlled environment is a vacuum.

Historically, stage assemblies used in a vacuum environment have utilized mechanical type bearings to support the stage. Typical mechanical type bearings include ball bearings, roller bearings or sliding contact. However, limitations on the use of lubricants in a vacuum, rolling or sliding noise or vibration, particle generation, and friction also limit the accuracy and velocity of such stages.

One solution is to use an air bearing in the vacuum to support the stage. However, air bearings typically require substantial preload forces to have high stiffness, which is desirable for precision stages. Unfortunately, it is not possible to create a vacuum preload type air bearing if the stage is surrounded by a vacuum.

Alternately, a lower air bearings and an opposed upper air bearing can be used to support the stage in the vacuum environment. In this embodiment, the upper air bearing preloads the lower air bearing to create a relatively stiff bearing. However, this design typically requires an increase in stage mass and/or complexity and an increase in the number of air bearings required by the stage assembly. In addition, the opposed air bearings can deform the stage.

Moreover, existing reticle stage mover assemblies include one or more moving motors that generate stray magnetic fields. Unfortunately, the stray magnetic fields of significant magnitude can influence the electron beam. Thus, with current reticle stage assemblies, the motors can influence the electron beam.

Additionally, in an electron beam exposure apparatus, a relatively narrow vertical gap exists between the illumination optical assembly and the projection optical assembly for positioning the reticle. Unfortunately, for existing reticle stage assemblies, the combination of the reticle stage base and the reticle stage is relatively thick. Further, existing reticle and wafer stage assemblies can have significant perturbations from the drag from control cables and hoses attached to the moving stage. As a result thereof, the perturbations can cause an alignment error between the reticle and the wafer. This reduces the accuracy of positioning of the wafer relative to the reticle and degrades the accuracy of the exposure apparatus.

In light of the above, there is a need for a stage assembly having relatively high acceleration and velocity capabilities that precisely positions a device. Another need is to provide a stage assembly having a stage that is relatively lightweight and relatively thin and that has relatively high modal frequencies. Further, there is a need for a stage assembly for positioning a device in a controlled environment such as a vacuum. Moreover, there is a need for a stage assembly that minimizes the perturbations on the stage caused by cable and hose drag and has relatively small stray magnetic fields. Additionally, there is a need for a stage assembly that does not include moving magnets or iron which will cause perturbations in existing magnetic fields. Further, there is a need for a stage assembly that minimizes moving conductors which can create eddy currents in existing magnetic fields and thereby alter the existing magnetic fields. Moreover, there is a need to provide a high performance stage assembly for an exposure apparatus that utilizes an electron beam. Furthermore, there is a need for an exposure apparatus capable of manufacturing precision objects, such as high density, semiconductor wafers.

SUMMARY

The present invention is directed to a stage assembly that precisely moves and positions a device. The stage assembly includes a device stage, a stage mover assembly and a follower assembly. The device stage retains the device. The stage mover assembly connects to the device stage and moves the device stage along a Y and X axes. The follower assembly includes a first follower frame. The first follower frame supports the device stage along a Z axis and allows the device stage to move along the Y and X axes.

Uniquely, the first follower frame is moved along the Y axis with the device stage. As provided herein, with this design, the device stage can be made relatively thin vertically, relatively light weight, and with high modal frequencies. Moreover, control cables and hoses which provide coolants or supply fluid to or from fluid bearings, that run to the device stage can be routed to the device stage via the first follower frame. This minimizes the perturbations from cable and hose drag.

Additionally, the stage mover assembly can be positioned behind the follower assembly away from the device. This minimizes the impact of stray magnetic fields from the stage mover assembly on the electron beam illumination source and projection optics of the exposure apparatus.

Preferably, the stage mover assembly moves the device stage along the X axis, along the Y axis and about the Z axis. This allows the stage assembly to accurately position the device. Moreover, a portion of the stage mover assembly preferably is attached directly to the device stage and pushes through a center of gravity of the device stage to enhance control over movement of the device stage.

As provided herein, the follower assembly also includes a first follower mover, a first follower guide, a first follower frame, and a pair of opposed stage fluid bearings. The first follower mover moves the first follower frame substantially concurrently with the device stage along the Y axis. The first follower guide supports the first follower frame. The pair of opposed stage fluid bearings support the device stage relative to the first follower frame and allow the device stage to move along the X axis, along the Y axis and about the Z axis relative to the first follower frame. The stage fluid bearings uncouple the device stage from most of the vibration experienced by the first follower frame and other components.

Preferably, the follower assembly also includes a first pair of opposed guide fluid bearings and a second pair of opposed guide fluid bearings that (i) support and guide the first follower frame relative to the first follower guide along the X axis, along the Z axis, about the X axis, about the Y axis and about the Z axis, and (ii) allow for movement of the first follower frame relative to the first follower guide along the Y axis.

Additionally, the follower assembly can include a second follower frame, a second follower guide and a second follower mover. In this design, the second follower frame also supports the device stage and allows the device stage to move along the X axis, along the Y axis and about the Z axis. Further, the second follower mover moves the second follower frame along the Y axis substantially concurrently with movement of the device stage. Further, in this design, the first follower frame supports the device stage near a first table side of the device stage and the second follower frame supports the stage mover assembly along the Z axis.

The present invention is also directed to an exposure apparatus, a device, a semiconductor wafer, a method for manufacturing a stage assembly, a method for manufacturing an exposure apparatus and a method for making a device utilizing the exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 9A is a bottom plan view of a portion of a vacuum compatible fluid bearing having features of the present invention;

FIG. 9B is a cut-away view of a portion of the fluid bearing of FIG. 9A;

FIG. 10A is a side illustration of a portion of the stage assembly;

FIG. 10B is a side illustration of another portion of the stage assembly;

DESCRIPTION

Figure 1:
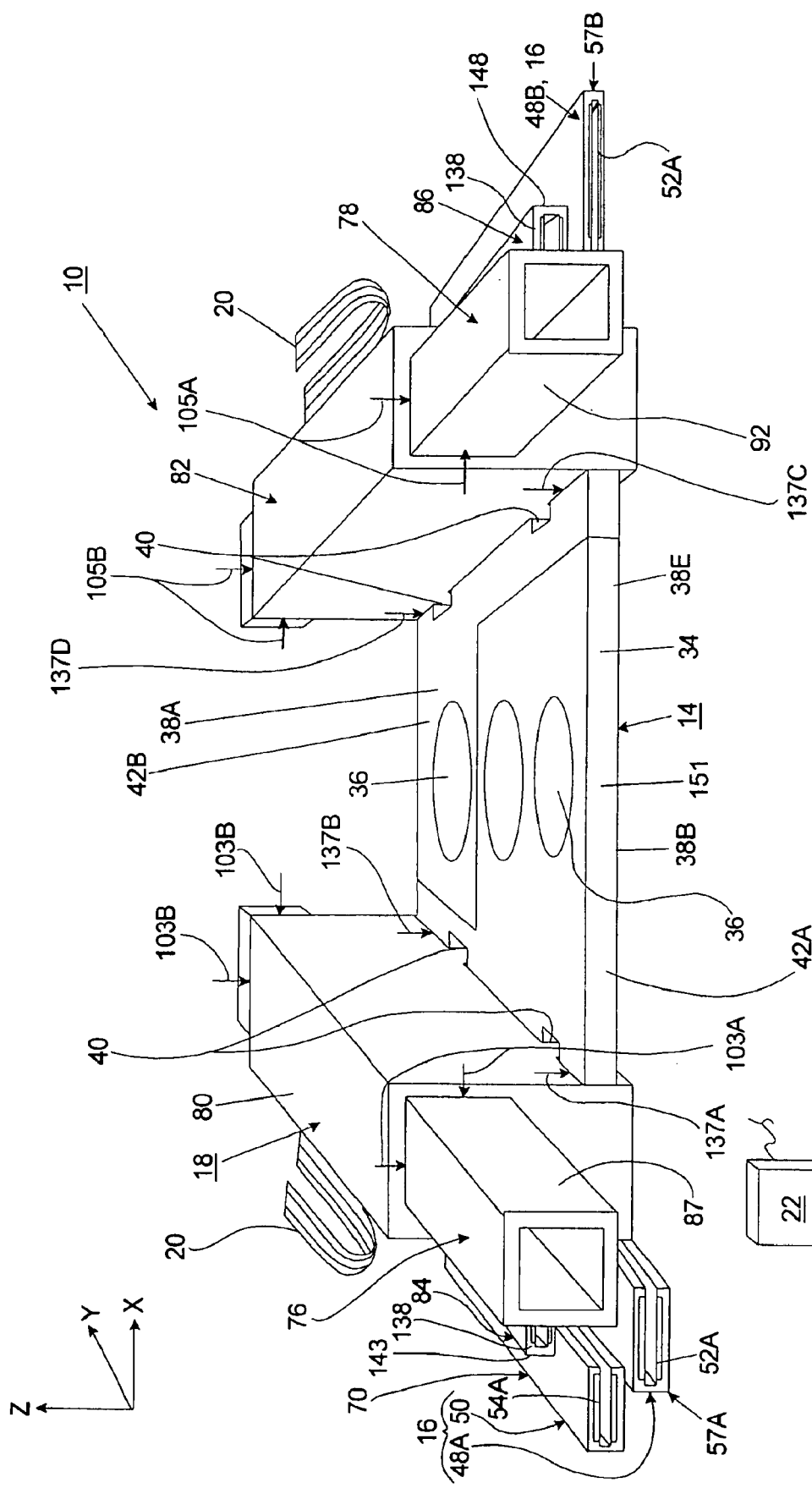
FIG. 1 is a top perspective of a stage assembly having features of the present invention.

Referring initially to FIGS. 1–5, a stage assembly 10 having features of the present invention, includes a device stage 14, a stage mover assembly 16, a follower assembly 18, one or more lines 20 (e.g. cables and/or hoses) and a control system 22. The stage assembly 10 is positioned above a mounting base 24 (illustrated in FIGS. 11 and 14). The stage assembly 10 is particularly useful for precisely positioning a device 26 (illustrated in FIGS. 11 and 14) during a manufacturing, measurement and/or an inspection process.

The type of device 26 positioned and moved by the stage assembly 10 can be varied. For example, referring to FIG. 11, the device 26 can be a reticle 32 and the stage assembly 10 can be used as part of an exposure apparatus 30 for precisely positioning the reticle 32 during manufacturing of a semiconductor wafer 28. Alternately, for example, the stage assembly 10 can be used to move other types of devices during manufacturing and/or inspection, to move a device under an electron microscope (not shown), or to move a device during a precision measurement operation (not shown).

Figure 11:
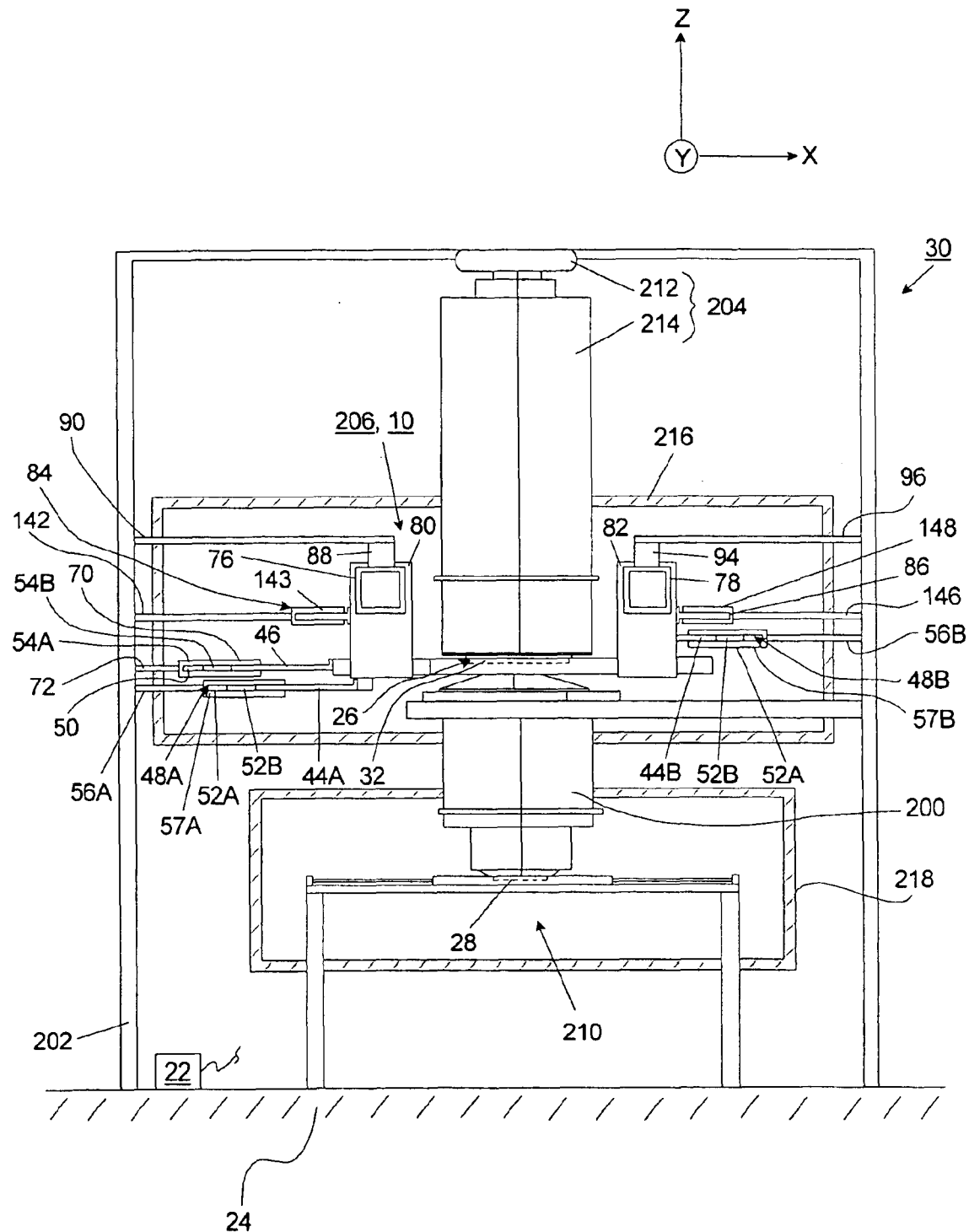
FIG. 11 is a side illustration of an exposure apparatus utilizing a stage assembly having features of the present invention.

As illustrated in FIG. 11, an exposure apparatus 30 can include a projection optical assembly 200, an apparatus frame 202, an illumination system 204, a reticle stage assembly 206, and a wafer stage assembly 210. The illumination system 204 includes an illumination source 212 that generates a beam of charged particles (not shown). One type of illumination source 212 is an electron beam generator that generates an electron beam. An electron beam can be influenced by AC magnetic fields of sufficient magnitude. Thus, minimizing the AC stray magnetic fields is an important consideration in an electron beam lithography, inspection, or metrology system.

Some of the Figures provided herein include a coordinate system that designates an X axis, a Y axis, and a Z axis. Each axis is substantially perpendicular to the other two axes. It should be understood that the coordinate system is merely for reference and can be varied. For example, the X axis can be switched with the Y axis and/or the stage assembly 10 can be rotated.

A couple of alternate embodiments of the stage assembly 10 are illustrated herein. In each embodiment, the stage assembly 10 is designed and controlled to minimize changing magnetic fields that can perturb an electron beam. Further, each embodiment is designed to operate in a controlled environment such as a vacuum. Moreover, the device stage 14 fits within a relatively small gap and the device stage 14 can be moved with a relatively high acceleration and velocity. As a result thereof, the stage assembly 10 provided herein is particularly useful in manufacturing, measurement and/or inspection processes (i) that are performed in a controlled environment, such as a vacuum, and/or (ii) that are influenced by varying magnetic fields.

The components of the stage assembly 10 can be made of a number of materials including ceramic, such as alumina or silicon carbide; metals such as aluminum; composite materials; or plastic. For processes such as e-beam lithography, which are sensitive to changing magnetic fields, it may be preferable to use non-conductive materials to minimize eddy currents caused by stage motion, which cause changes in the magnetic field. Preferably, the stage assembly 10 is constructed and assembled using vacuum compatible materials and procedures.

The device stage 14 retains one or more devices 26. The design of the device stage 14 can be varied to suit the design requirements of the stage assembly 10. In the embodiment illustrated in the Figures, the device stage 14 includes a device table 34, a portion of the stage mover assembly 16, and one or more table openings 36.

Figure 6:
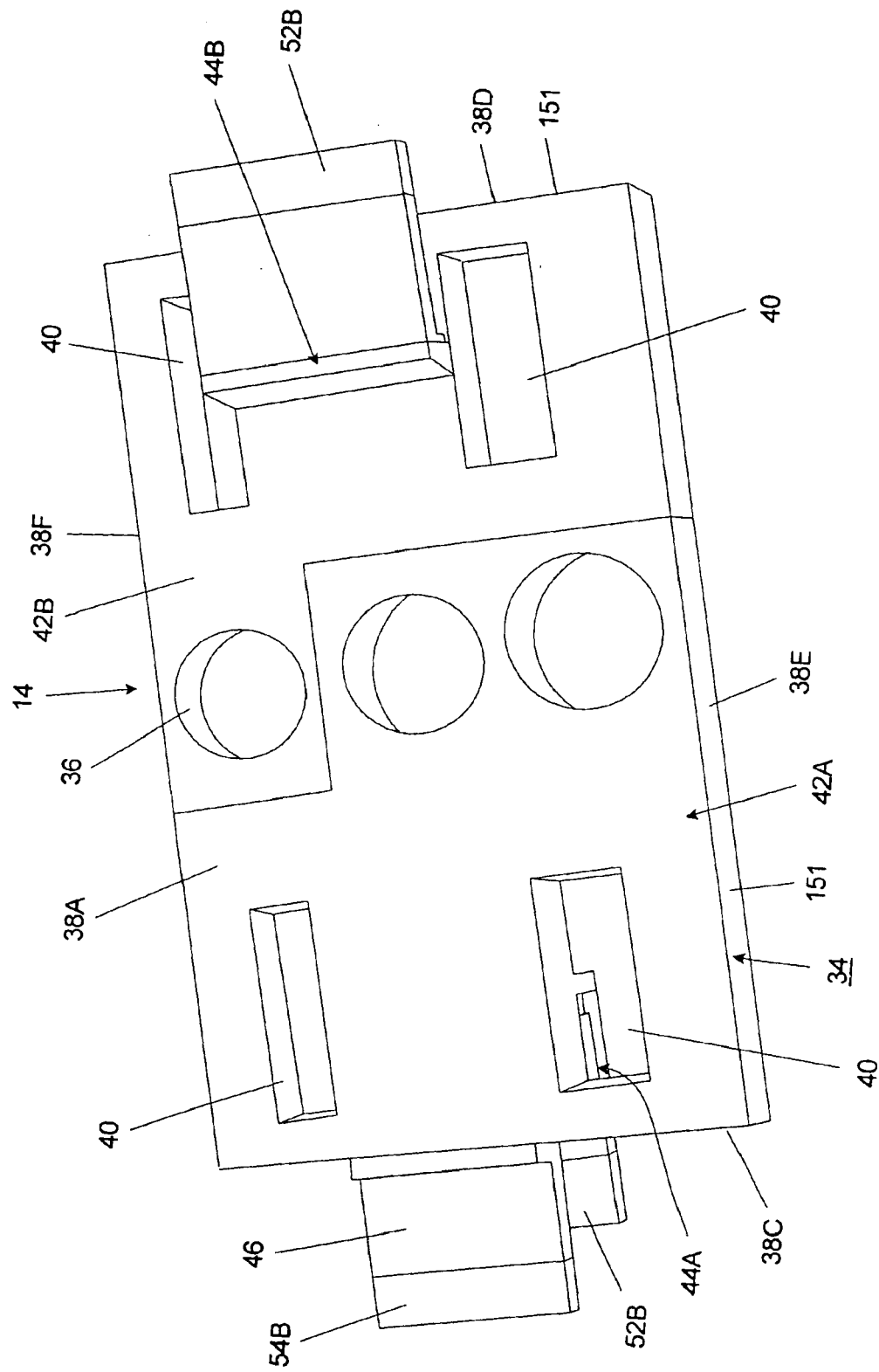
FIG. 6 is a top perspective view of a device stage having features of the present invention.

Referring to FIG. 6, the device table 34 is generally rectangular, flat plate shaped and includes (i) a table top 38A, (ii) a table bottom 38B, (iii) a first table side 38C, (iv) a second table side 38D that is substantially opposed from the first table side 38C, (v) a front table side 38E, and (vi) a rear table side 38F. Additionally, the device table 34 includes four, rectangular shaped, spaced apart, stage apertures 40 that allow a portion of the follower assembly 18 to extend through the device table 34. Two of the stage apertures 40 are positioned near the first table side 38C and two of the stage apertures 40 are positioned near the second table side 38D. The stage apertures 40 must be large enough to allow for movement of the device table 34 relative to the follower assembly through the full stroke of the device table 34 along the X axis.

With the use of the follower assembly 18 no bearings are attached to the device table 34. As a result thereof, the device table 34 can be made relatively light weight, and relatively thin, and the device table 34 with relatively high, flexible modal frequencies. As provided herein, the device table 34 can have a vertical thickness of less than approximately 63 millimeters so that the device table 34 can fit between the illumination optical assembly 214 and the projection optical assembly 200 of an electron beam exposure apparatus 30.

Figure 2:
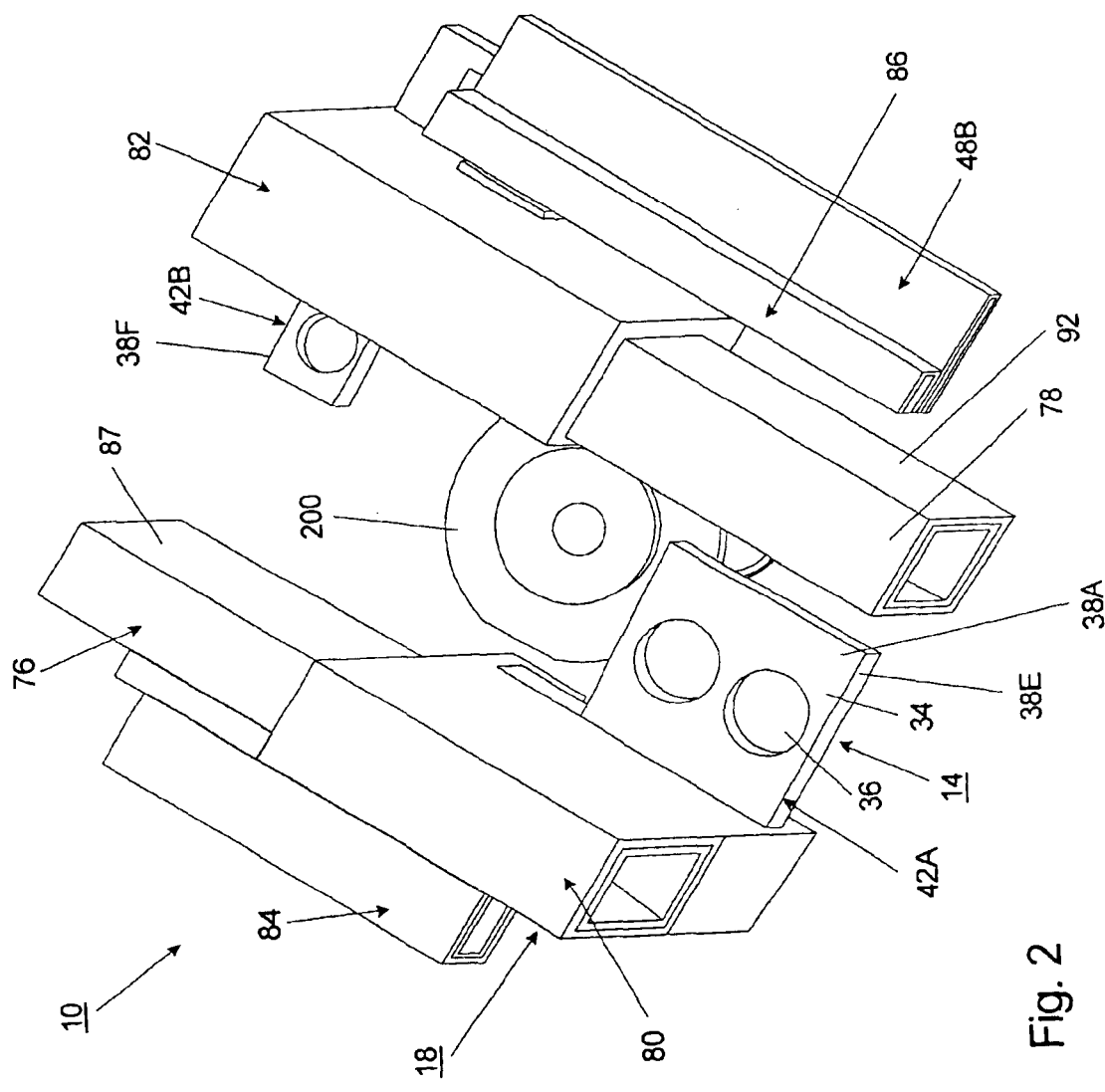
FIG. 2 is a top perspective view of the stage assembly of FIG. 1, with a device stage separated and a projection optical assembly.
Figure 2:
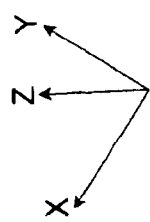
Figure 3:
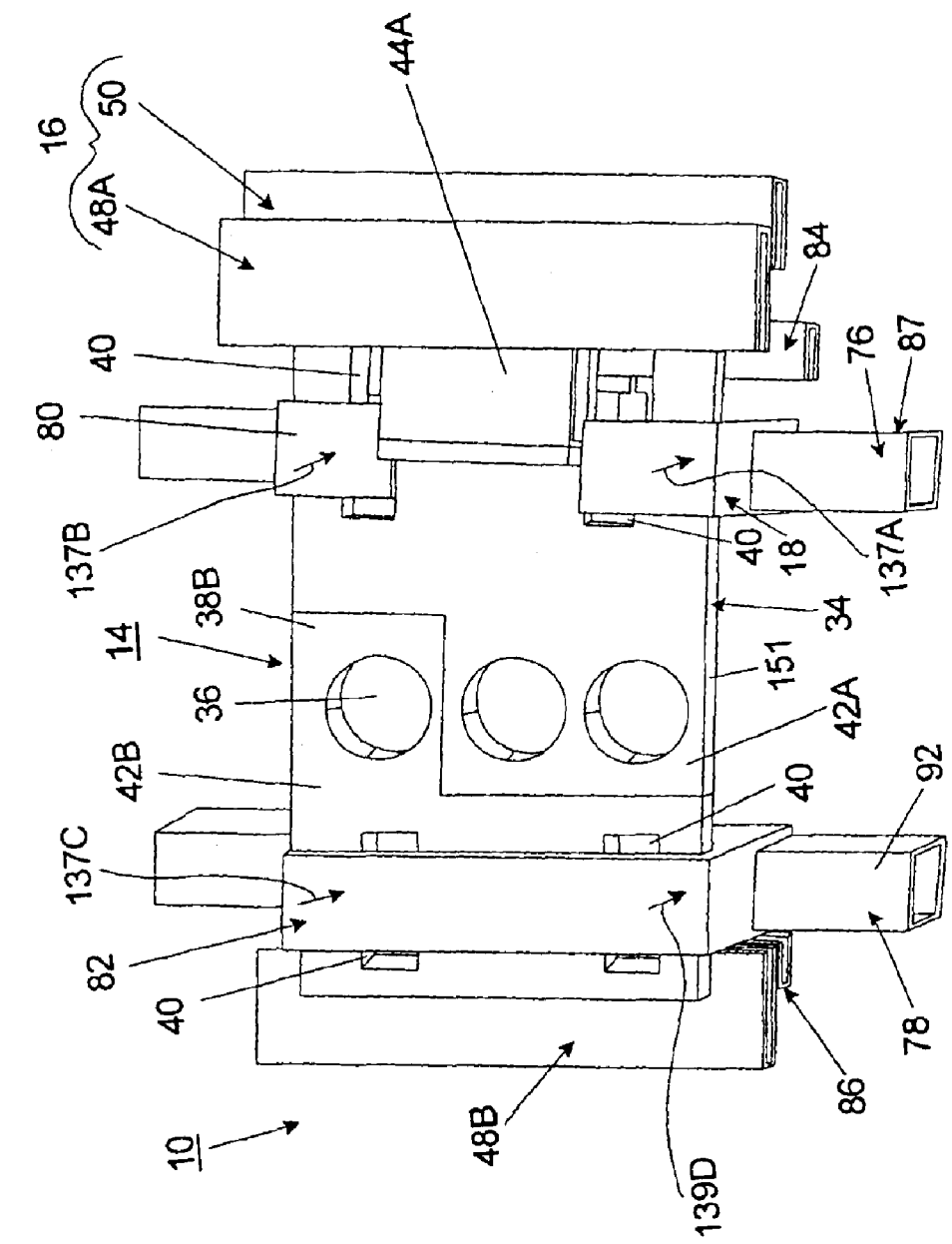
FIG. 3 is a bottom perspective view of the stage assembly of FIG. 1.
Figure 3:
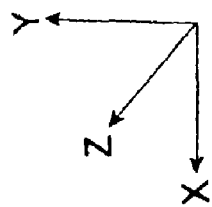
Figure 4:
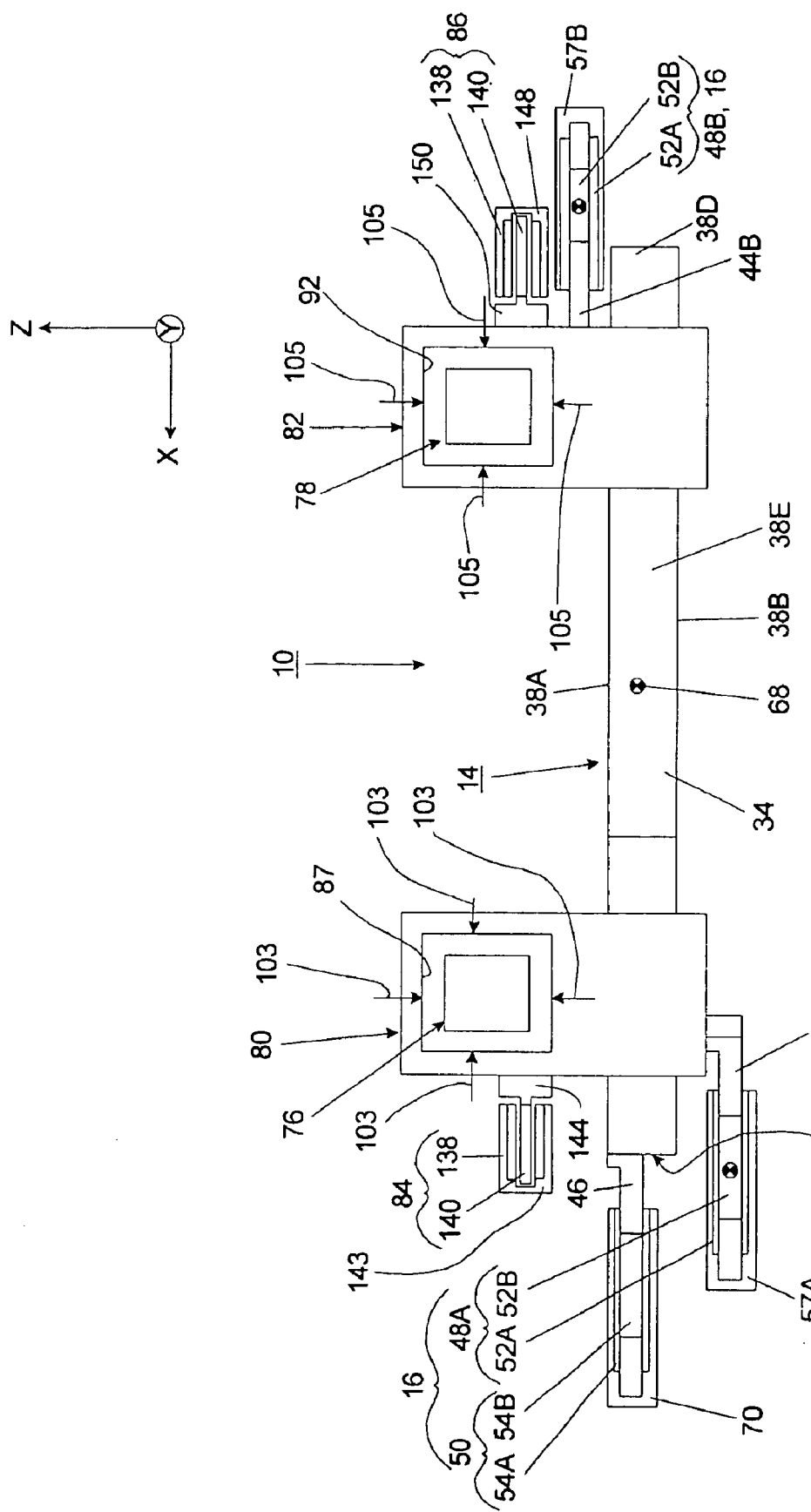
FIG. 4 is a side plan view of the stage assembly of FIG. 1.
Figure 5:
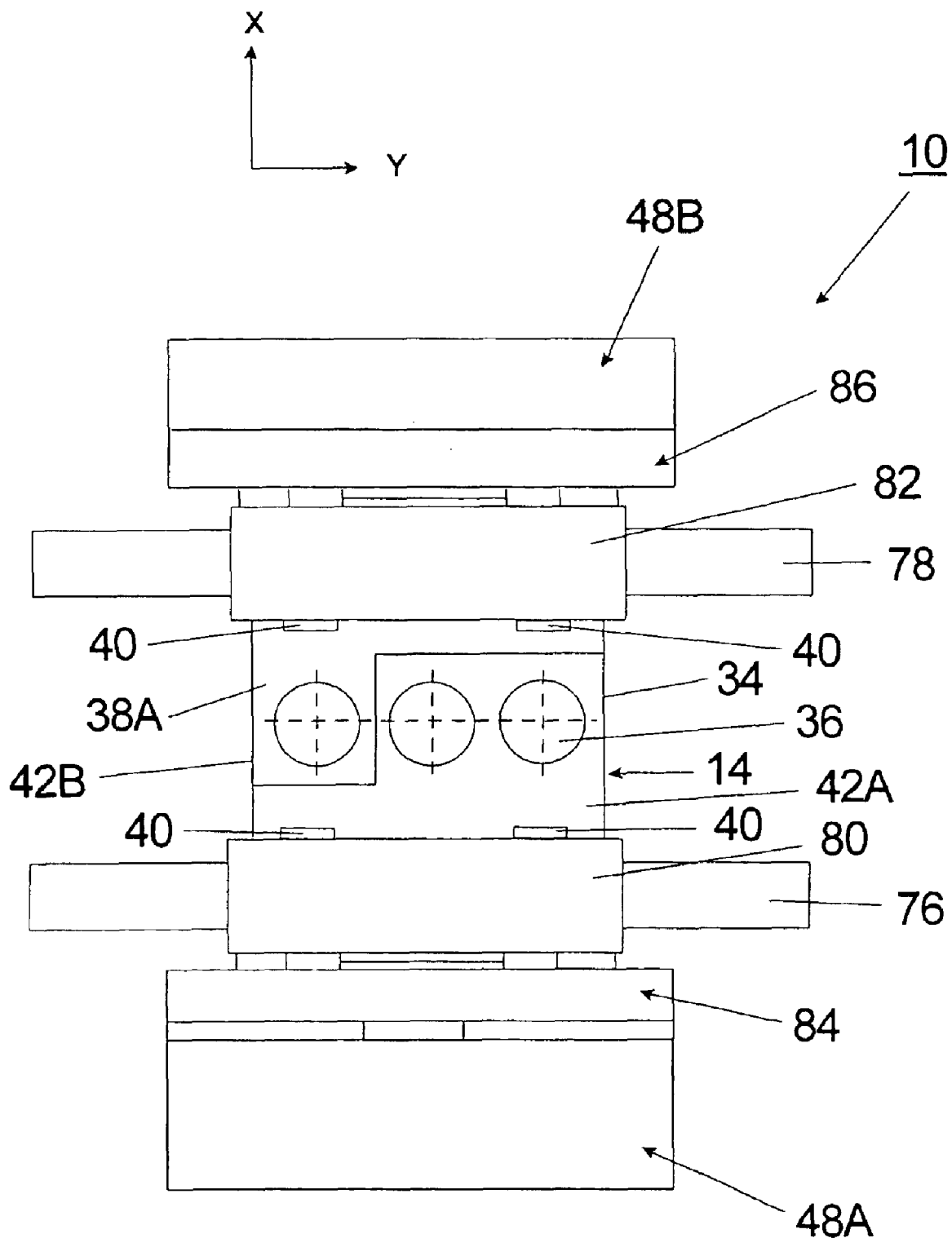
FIG. 5 is a top plan view of the stage assembly of FIG. 1.

The device table 34 can be made of multiple sections that separate and allow for relatively easy access to other components of the machine. In the embodiment illustrated in FIGS. 1–6, the device table 34 includes a first table section 42A and a second table section 42B that are selectively secured together. As illustrated in FIG. 2, this design allows the first table section 42A and the second table section 42B to separate to provide relatively easy access to service and remove the projection optical assembly 200. In the embodiment illustrated in the Figures, each of the table sections 42A, 42B is somewhat flat and "L" shaped. The table sections 42A, 42B can be mechanically secured together to provide stiffness to the device table 34. The table sections 42A, 42B, for example, can be secured together with alignment pins (not shown) and/or tongue and groove type structures. Alternately, the device table 34 can be made as a single unitary structure. Each of the table sections 42A, 42B can retain one or more devices 26.

The table openings 36 extend transversely through the device table 34 along the Z axis and allow for the passage of the electron beam through the device 26 to the projection optical assembly 200. The number of table openings 36 in the device table 34 can be varied to suit the design requirements of the stage assembly 10. In the embodiment illustrated in the Figures, the device table 34 includes three table openings 36 that are spaced apart and are aligned along the Y axis. Preferably, each of the table openings 36 includes a device holder (not shown) that retains the device 26 during movement. The device holder can be a vacuum chuck, an electrostatic chuck, or some other type of clamp.

Referring to FIG. 6, the device stage 14 also includes a first Y stage bracket 44A, a second Y stage bracket 44B and a X stage bracket 46 for securing a portion of the stage mover assembly 16 directly to the device stage 14. Each of the Y stage brackets 44A, 44B is somewhat "L" shaped. The first Y stage bracket 44A is secured to and cantilevers away from the table bottom 38B near the first table side 38C between two of the stage apertures 40. Similarly, the second Y stage bracket 44B is secured to and cantilevers away from the table top 38A near the second table side 38D between two of the stage apertures 40. The X stage bracket 46 is generally plate shaped and cantilevers away from the first table side 38C above the first Y bracket 44A.

The stage mover assembly 16 moves the device stage 14 relative to the mounting base 24 and the other components of the exposure apparatus 30 under the control of the control system 22. The exact design of the stage mover assembly 16 and the movement of the device stage 14 can be varied to suit the movement requirements of the stage assembly 10. In each embodiment illustrated herein, the stage mover assembly 16 moves the device stage 14 along the X axis, along the Y axis, and about the Z axis under the control of the control system 22. Preferably, the stage mover assembly 16 moves the device stage 14 with a relatively high acceleration and velocity.

In the embodiment illustrated in FIGS. 1–5, the stage mover assembly 16 includes a first Y stage mover 48A, a second Y stage mover 48B, and an X stage mover 50. The Y stage movers 48A, 48B move the device stage 14 with a relatively large displacement along the Y axis and with a limited range of motion about the Z axis (theta Z), and the X stage mover 50 moves the device stage 14 with a relatively intermediate displacement along the X axis.

The design of each of the stage movers 48A, 48B, 50 can be varied to suit the movement requirements of the stage assembly 10. For example, each of the stage movers 48A, 48B, 50 can include one or more rotary motors, voice coil motors, linear motors, electromagnetic actuators, or any other type of actuators. In the embodiments provided herein, each of the Y stage movers 48A, 48B includes a Y reaction component 52A and an adjacent Y moving component 52B that interacts with the Y reaction component 52A. Somewhat similarly, the X stage mover 50 includes a X reaction component 54A and an adjacent X moving component 54B that interacts with the X reaction component 54A.

In the embodiments provided herein, for each of the Y stage movers 48A, 48B one of the Y components 52A, 52B includes one or more magnet arrays and the other Y component 52A, 52B includes one or more conductor arrays. Similarly, for the X stage mover 50, one of the X components 54A, 54B includes one or more magnet arrays and the other X component 54A, 54B includes one or more conductor arrays.

Each magnet array includes one or more magnets. The design of each magnet array and the number of magnets in each magnet array can be varied to suit the design requirements of the stage movers 48A, 48B, 50. Each magnet can be made of a permanent magnetic material such as NdFeB. Each conductor array includes one or more conductors. The design of each conductor array and the number of conductors in each conductor array is varied to suit the design requirements of the stage movers 48A, 48B, 50. Each conductor can be made of metal such as copper or any substance or material responsive to electrical current and capable of creating a magnetic field such as superconductors.

Electrical current (not shown) is supplied to each conductor array by the control system 22. For each of the stage movers 48A, 48B, 50, the electrical current in the conductor array interacts with the magnetic field(s) generated by the one or more of the magnets in the magnet array. This causes a force (Lorentz type force) that can be used to move the device stage 14.

Specifically, the Y reaction component 52A and the Y moving component 52B of each Y stage mover 48A, 48B interact to selectively move the device stage 14 along the Y axis and about the Z axis. In the embodiment illustrated herein, each of the Y stage movers 48A, 48B is a linear motor. The Y reaction component 52A for the first Y stage mover 48A is secured to the apparatus frame 202 and the mounting base 24 with a first Y reaction frame 56A (illustrated in FIG. 11) and a first Y reaction bracket 57A, and the Y moving component 52B of the first Y stage mover 48A is secured to the first Y stage bracket 44A and the device table 34. Similarly, the Y reaction component 52A for the second Y stage mover 48B is secured to the apparatus frame 202 and the mounting base 24 with a second Y reaction frame 56B (illustrated in FIG. 11) and a second Y reaction bracket 57B while the Y moving component 52B of the second Y stage mover 48B is secured to the second Y stage bracket 44B and the device table 34.

In this embodiment, the Y reaction component 52A of each Y stage mover 48A, 48B includes a pair of spaced apart magnet arrays while the Y moving component 52B of each Y stage mover 48A, 48B includes a conductor array. With this design, for each of the Y stage movers 48A, 48B, the Y moving component 52B is secured to the device table 34 and positioned between the magnet arrays of the respective Y reaction component 52A.

The Y stage movers 48A, 48B make relatively large displacement adjustments to the position of the device table 34 along the Y axis. The required stroke of the Y stage movers 48A, 48B along the Y axis will vary according to desired use of the stage assembly 10. For an exposure apparatus 30, generally, the stroke of the Y stage movers 48A, 48B for moving the reticles 32 is between approximately two hundred and fifty millimeters and nine hundred millimeters.

The Y stage movers 48A, 48B also make relatively slight adjustments to position of the device stage 14 about the Z axis. In order to make the adjustments about the Z axis, the Y moving component 52B of one of the Y stage movers 48A, 48B is moved relative to the Y moving component 52B of the other Y stage mover 48A, 48B. With this design, the Y stage movers 48A, 48B generate torque about the Z axis.

Figure 7:
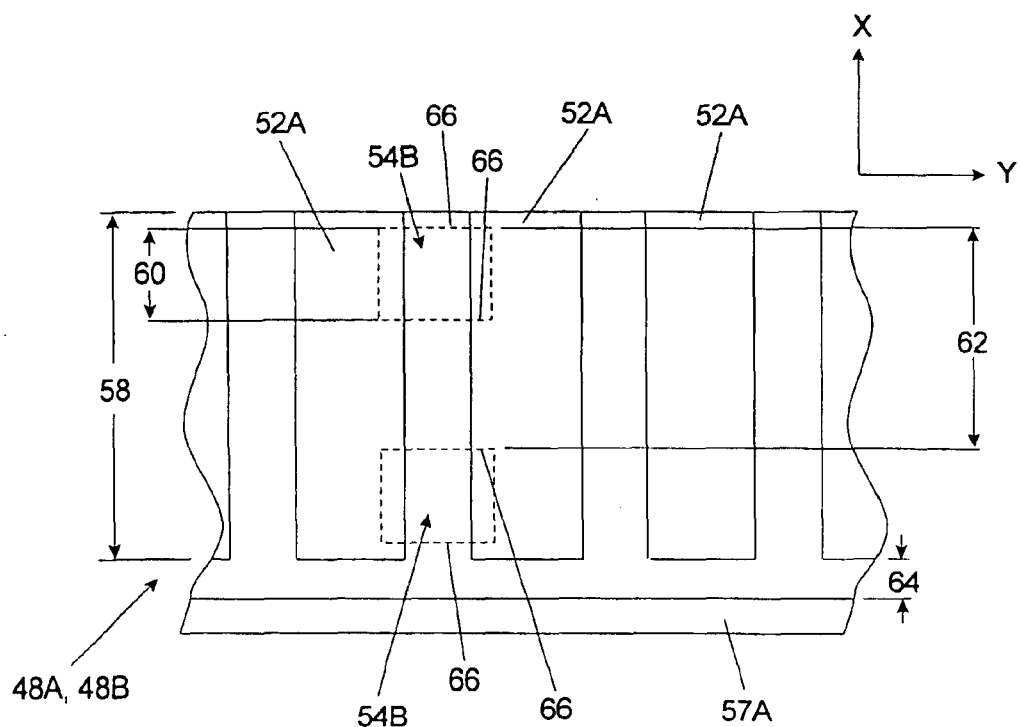
FIG. 7 is an illustration of a portion of a Y stage mover having features of the present invention.

Referring to FIG. 7, it should be noted that the magnets in the Y reaction component 52A of each of the Y stage movers 48A, 48B are relatively long in the X axis. More specifically, a magnet length 58 of the magnets of the Y stage movers 48A, 48B along the X axis is long enough so that the Y stage movers 48A, 48B can provide a Y force over the range of the X positions of the Y stage movers 48A, 48B. It should be noted in FIG. 7, that the conductor array is illustrated in phantom at each end of the X stroke 62 to illustrate the movement of the conductor array along the X axis.

As provided herein, the magnet length 58 is equal to or greater than the combination of (i) a conductor length 60 of the conductor array and (ii) the stroke 62 of the X stage mover 50 during normal operation. Further, it should be noted that the magnets are positioned a safety gap 64 away from a back of the Y reaction bracket 57A, 57B to allow for extra mechanical stroke for safety. This design allows the conductor array of the Y moving component 52B of each of the Y stage movers 48A, 48B to effectively interact with the respective magnets of the Y reaction component 52A of the Y stage movers 48A, 48B, as the device stage 14 is moved along a normal stroke along the X axis of the device stage 14. Stated another way, the conductor array remains completely between the magnets throughout the complete normal movement of the device stage 14 along the X axis. As a result thereof, both ends 66 of the conductor array remain within the magnets so that the forces along the X axis that are generated by the ends 66 of the conductor array are cancelled out.

This design eliminates the need to move the magnets of the Y stage movers 48A, 48B as the device stage 14 is moved along the X axis. Stated another way, the magnets of the Y stage movers 48A, 48B remain substantially in the same position during movement of the device stage 14 along the X axis. Because magnetic fields from the magnets can influence the energy beam from a charge particle exposure apparatus 30, it is preferably to maintain the magnets in a fixed position so that the influence from the magnets is constant and can be compensated.

Alternately, for example, the Y stage movers 48A, 48B could be designed so that the Y reaction component 52A includes a conductor array while the Y moving component 52B includes a pair of spaced apart magnet arrays. However, this design is less desirable because of the moving magnetic field.

Still alternately, the magnets could be relatively short and the conductor array relative long, so that the ends of the coils always extend beyond the magnetic field region. However, this design is not very efficient and it may require that the Y reaction brackets 57A, 57B be deeper and the Y stage brackets 44A, 44B be longer.

As provided herein, the Y stage movers 48A, 48B can be positioned to push through a stage center of gravity 68 (illustrated in FIG. 4) of the device stage 14. In the embodiment illustrated herein, the first Y stage mover 48A is positioned below the stage center of gravity 68 and the second Y stage mover 48B is positioned above the stage center of gravity 68. More specifically, the center of gravity 68 is positioned on a line that extends between the center of the first Y stage mover 48A and the center of the second Y stage mover 48B. With this design, the first Y stage mover 48A is positioned at approximately the same distance along the Z axis below the stage center of gravity 68 as the second Y stage mover 48B is positioned above the stage center of gravity 68 along the Z axis. This minimizes the amount of tilt and yaw experienced by the device stage 14 during acceleration by the Y stage movers 48A, 48B.

Similarly, the X reaction component 54A and the X moving component 54B of the X stage mover 50 interact to selectively move the device stage 14 along the X axis. In the embodiment illustrated herein, the X stage mover 50 is a linear motor. The X reaction component 54A for the X stage mover 50 is secured to the apparatus frame 202 and the mounting base 24 with an X reaction bracket 70 and a X reaction frame 72 (illustrated in FIG. 11) and the X moving component 54B of the X stage mover 50 is secured to the X stage bracket 46 and the device table 34.

In this embodiment, the X reaction component 54A of the X stage mover 50 includes a pair of spaced apart magnet arrays while the X moving component 54B includes a conductor array. With this design, the X moving component 54B is secured to the device table 34 and positioned between the magnet arrays of the X reaction component 54A.

With this design, the X stage mover 50 makes adjustments to the position of the device table 34 along the X axis. The required stroke of the X stage mover 50 along the X axis will vary according to desired use of the stage assembly 10. For an exposure apparatus 30, generally, the stroke of the X stage mover for moving the reticles 32 is between approximately one hundred and fifty millimeters and two hundred millimeters.

Preferably, the X stage mover 50 is positioned to push through the stage center of gravity 68 (illustrated in FIG. 4) of the device stage 14. In the embodiment illustrated herein, the X stage mover 50 is positioned at approximately the same location along the Z axis and at approximately the same location along the Y axis as the stage center of gravity 68. This minimizes the amount of tilt and yaw experienced by the device stage 14 during acceleration by the X stage mover 50.

With the embodiment illustrated in FIGS. 1–5, the stage movers 48A, 48B, 50 are positioned near the table sides 38C, 38D away from the table openings 36 and the reticles 32. This reduces the influence of stray magnetic fields from the stage movers 48A, 48B, 50 on an electron beam.

The follower assembly 18 supports the device stage 14 near the table sides 38C, 38D and a portion of the follower assembly 18 moves somewhat concurrently with the device stage 14 along the Y axis. This allows for the use of a relatively thin, lightweight device stage 14. Further, the follower assembly 18 reduces the number of cables and hoses (collectively referred to as "lines") 20 that are secured to the device stage 14 and the relative movement of the lines 20 that extend to the device stage 14. This reduces and minimizes the amount of disturbance and drag from the lines 20 that is transferred to the device stage 14. Thus, the follower assembly 18 reduces and minimizes the influence of the lines 20 on the position of the device stage 14. This improves the positioning performance of the stage assembly 10. For an exposure apparatus 30, this allows for more accurate positioning of the reticle 32 relative to the semiconductor wafer 28. It can also allow greater stage accelerations and therefore higher processing throughputs.

The design of the follower assembly 18 can be varied according to the design requirements of the stage assembly 10. In the embodiment illustrated in FIGS. 1–5, the follower assembly 18 includes a first follower guide 76, a second follower guide 78, a first follower frame 80, a second follower frame 82, a first follower mover 84, and a second follower mover 86. As an overview, in this embodiment, the device stage 14 is supported on opposite sides 38C, 38D by the follower assembly 18 and the stage assembly 10 resembles a bridge type configuration.

The first follower guide 76 supports the first follower frame 80 and guides the movement of the first follower frame 80. In the embodiment illustrated in the Figures, the first follower guide 76 is generally rectangular tube shaped and includes four, first guide sides 87. Referring to FIG. 11, the first follower guide 76 can be secured with a first front guide isolator 88, a first rear guide isolator (not shown), a first front guide frame 90, and a first rear guide frame (not shown) to the apparatus frame 202 and the mounting base 24. The first front guide frame 90 extends between the apparatus frame 202 and near the front of the first follower guide 76, and the second front guide frame extends between the apparatus frame 202 and near the rear of the first follower guide 76. The first front guide isolator 88 is positioned between the first front guide frame 90 and the first follower guide 76. Further, the first rear guide isolator is positioned between the first rear guide frame and the first follower guide 76. The guide isolators 88 reduce the effect of vibration of the guide frames 90 and the apparatus frame 202 causing vibration on the first follower guide 76. Each first guide isolator 88 can include a pneumatic cylinder (not shown) and an actuator (not shown). Suitable first guide isolators 88 are sold by Technical Manufacturing Corporation, located in Peabody, Mass., or Newport Corporation located in Irvine, Calif.

In the embodiment illustrated in FIG. 11, the first front guide frame 90 is secured to the front of the first follower guide 76, above the first follower guide 76. Alternately, for example, the first follower guide 76 could be positioned above the first front guide isolator 88 and the first front guide frame 90.

Still alternatively, for example, the first follower guide 76 can be secured to the projection optical assembly 200 to inhibit relative movement between the first follower guide 76 and the projection optical assembly 200.

Similarly, the second follower guide 78 supports the second follower frame 82 and guides the movement of the second follower frame 82. In the embodiment illustrated in the Figures, the second follower guide 78 is generally rectangular tube shaped and includes four, second guide sides 92. Referring to FIG. 11, the second follower guide 78 can be secured with a second front guide isolator 94, a second rear guide isolator (not shown), a second front guide frame 96, and a second rear guide frame (not shown) to the apparatus frame 202 and the mounting base 24. The second guide isolators 94 reduce the effect of vibration of the guide frames 96 and the apparatus frame 202 causing vibration on the second follower guide 78. Each second guide isolator 94 can include a pneumatic cylinder (not shown) and an actuator (not shown).

Still alternately, for example, the second follower guide 78 can be secured to the projection optical assembly 200 to inhibit relative movement between the second follower guide 78 and the projection optical assembly 200.

In the embodiment illustrated in FIG. 11, the second front guide frame 96 is secured to the front of the second follower guide 78, above the second follower guide 78. Alternately, for example, the second follower guide 78 could be positioned above the second front guide isolator 94 and the second front guide frame 96.

The follower guides 76, 78 are shown positioned in the same plane. However, this is not necessary. Also, the axes of the follower guides 76, 78 do not have to be parallel to a high degree of accuracy. This simplifies assembly and alignment of the stage assembly 10.

Figure 8B:
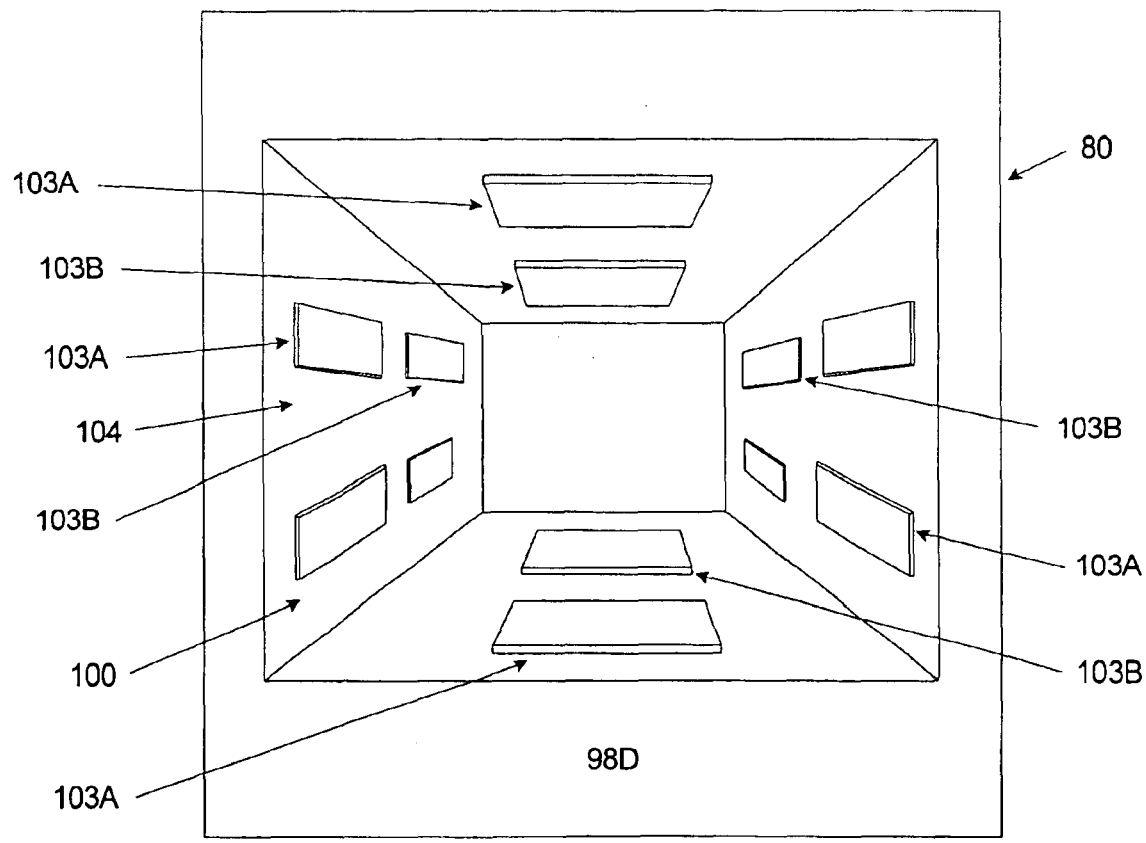
FIG. 8B is a perspective view of another portion of the follower assembly.
Figure 8A:
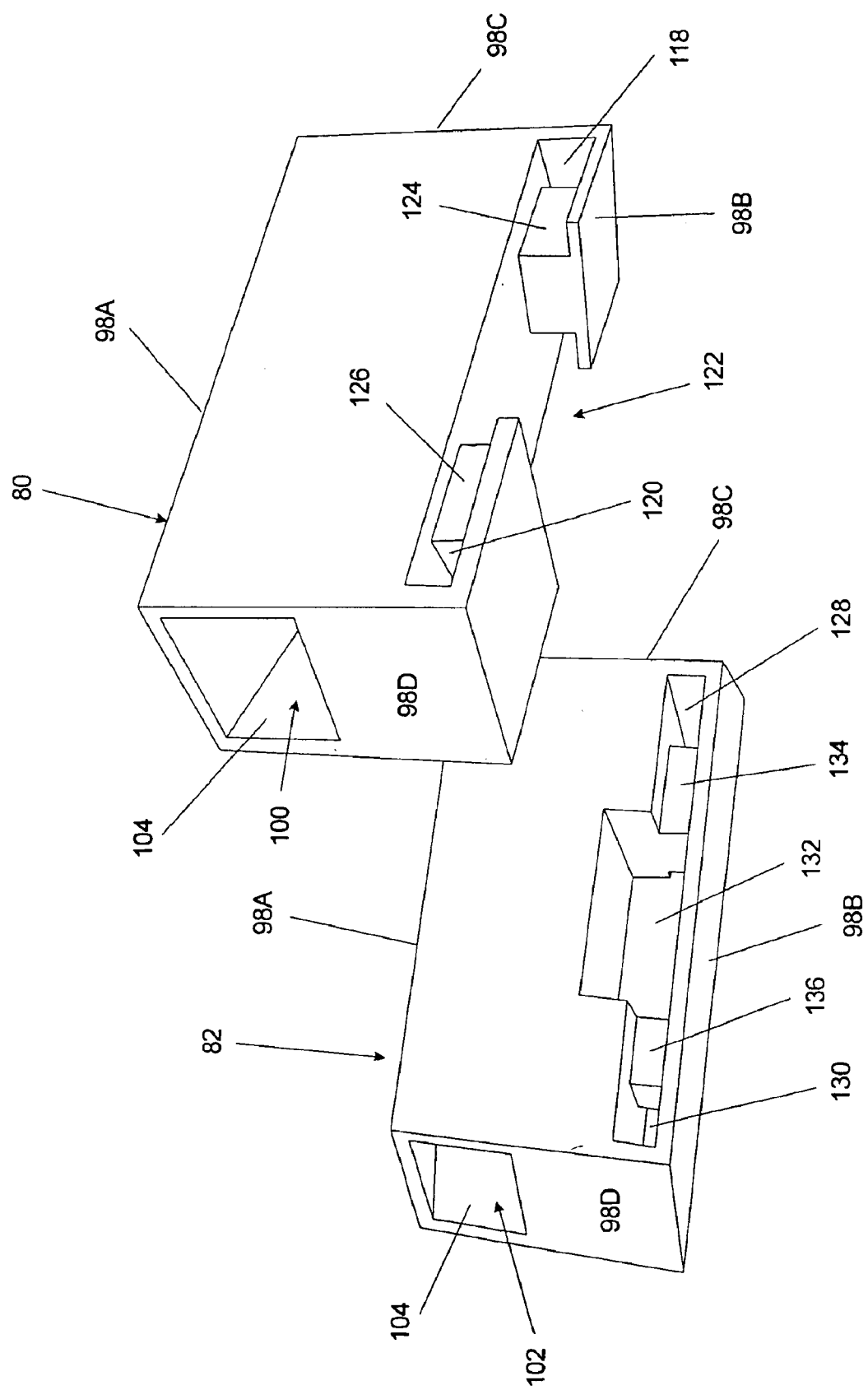
FIG. 8A is a perspective view of a portion of a follower assembly having features of the present invention.

In the embodiment illustrated in FIGS. 1–5, the first follower frame 80 and the second follower frame 82 cooperate to support the device stage 14 and allow for motion of the device stage 14 along the X axis, along the Y axis and about the Z axis. Moreover, the follower frames 80, 82 cooperate to support device stage 14 near the first table side 38C and the second table side 38D. Further, the follower frames 80, 82 eliminate the need to attach fluid lines for fluid bearings to the device stage 14. Moreover, the follower frames 80, 82 support the stage cables and hoses 20 near the device stage 14. Referring to FIG. 8A, in the embodiment illustrated in the Figures, each of follower frames 80, 82 is somewhat rectangular shaped and includes a frame top 98A, a frame bottom 98B, a frame front 98C, and a frame rear 98D.

Further, the first follower frame 80 includes a first guide channel 100, and the second follower frame 82 includes a second guide channel 102. The first guide channel 100 is sized and shaped to receive the first follower guide 76, and the second guide channel 102 is sized and shaped to receive the second follower guide 78. In the embodiment illustrated in the Figures, the first guide channel 100 is a generally rectangular shaped opening that extends along the longitudinal axis of the first follower frame 80, and the second guide channel 102 is a generally rectangular shaped opening that extends along the longitudinal axis of the second follower frame 82. Each of the guide channels 100, 102 is defined by four channel sides 104.

In this embodiment, a separate front guide fluid bearing 103A (illustrated as an arrow in FIG. 4) is formed between each of the channel sides 104 of the first guide channel 100 and each of the first guide sides 87 of the first follower guide 76. Stated another way, a pair of opposed front fluid guide bearings 103A maintain the first follower frame 80 spaced apart from the first follower guide 76 along the Z axis and a pair of opposed front guide fluid bearings 103A maintain the first follower frame 80 spaced apart from the first follower guide 76 along the X axis. The opposed front guide fluid bearings 103A allow for motion of the first follower frame 80 relative to the first follower guide 76 along the Y axis. Further, the stiffness along the X axis and the Z axis can be controlled by controlling the flow of fluid to the opposed front guide fluid bearings 103A. Referring to FIG. 8B, it should be noted that each front fluid guide bearing 103A can include one or more spaced apart fluid pads.

Additionally, a separate rear guide fluid bearing 103B (illustrated as an arrow in FIG. 4) is formed between each of the channel sides 104 of the second guide channel 102 and each of the first guide sides 87 of the first follower guide 76 near the rear of the first follower frame 80. Stated another way, a pair of opposed rear fluid guide bearings 103B maintain the first follower frame 80 spaced apart from the first follower guide 76 along the Z axis and a pair of opposed rear guide fluid bearings 103B maintain the first follower frame 80 spaced apart from the first follower guide 76 along the X axis. The opposed rear guide fluid bearings 103B allow for motion of the first follower frame 80 relative to the first follower guide 76 along the Y axis. Further, the stiffness along the X axis and the Z axis can be controlled by controlling the flow of fluid to the opposed rear guide fluid bearings 103B. It should be noted that each rear fluid guide bearing 103B can include one or more spaced apart fluid pads.

Similarly, a separate front guide fluid bearing 105A (illustrated as an arrow in FIG. 4) is formed between each of the channel sides 104 of the second guide channel 102 and each of the second guide sides 92 of the second follower guide 78 near the front of the second follower frame 82. Stated another way, a pair of opposed front guide fluid bearings 105A maintain the second follower frame 82 spaced apart from the second follower guide 78 along the Z axis and a pair of opposed guide fluid bearings 105 maintain the second follower frame 82 spaced apart from the second follower guide 78 along the X axis. The pair of opposed front guide fluid bearings 105A allow for motion of the second follower frame 82 relative to the second follower guide 78 along the Y axis. Further, the stiffness along the X axis and the Z axis can be controlled by controlling the flow of fluid to the opposed front guide fluid bearings 105A. Each front fluid guide bearing 105A can include one or more spaced apart fluid pads.

Additionally, a separate rear guide fluid bearing 105B (illustrated as an arrow in FIG. 4) is formed between each of the channel sides 104 of the second guide channel 102 and each of the second guide sides 92 of the second follower frame near the rear of the second follower frame 82. Stated another way, a pair of opposed rear fluid guide bearings 105B maintain the second follower frame 82 spaced apart from the second follower guide 78 along the Z axis, and a pair of opposed rear guide fluid bearings 105B maintain the second follower frame 82 spaced apart from the second follower guide 78 along the X axis. The opposed rear guide fluid bearings 105B allow for motion of the second follower frame 82 relative to the second follower guide 78 along the Y axis. Further, the stiffness along the X axis and the Z axis can be controlled by controlling the flow of fluid to the opposed rear guide fluid bearings 105B. It should be noted that each rear fluid guide bearing 105A can include one or more fluid pads.

Each guide fluid bearing 103A, 103B, 105A, 105B is preferably designed to minimize fluid that is released to the environment. FIGS. 9A and 9B illustrate a vacuum compatible fluid bearing having features of the present invention. In this embodiment, each fluid bearing includes a plurality of spaced apart fluid outlets 106, flat surfaces 108 and a plurality of fluid inlets 112 that form the fluid bearings. Each flat surface 108 is surrounded by a plurality of concentric, annular grooves 110 which are in fluid communication with the fluid inlets 112. Each successive groove 110 is separated from the next by lands that are substantially in the same plane as the bearing surface 108. Pressurized fluid or gas is released from a fluid source 114 (illustrated in FIG. 9B) through the fluid outlets 106 towards an opposed surface 115. Each fluid inlet 112 is connected to successive lower pressures in order to recover most of the fluid flow from the fluid outlets 106 and minimize the fluid reaching the vacuum chamber. FIG. 9B illustrates that three concentric grooves 110 surround each bearing surface 108. FIG. 9B also illustrates that some leakage 116 of the fluid occurs. A more detailed description of a suitable fluid bearing is described in International Application No. PCT/US00/04223, entitled "STATIC PRESSURE AIR BEARING", filed Feb. 18, 2000, inventors Watson et al. As far as permitted, the contents of International Application No. PCT/US00/04223 are incorporated herein by reference.

Alternately, another suitable vacuum compatible fluid bearing is disclosed in U.S. Pat. No. 6,126,169.

Still alternately, the respective follower frames 80, 82 can be supported spaced apart from the respective follower guides 76, 78 in other ways. For example, a magnetic type bearing (not shown) or a roller bearing type assembly (not shown) could be utilized. Still alternately, a vacuum preload type fluid bearing can be utilized if the stage assembly 10 is not used in a vacuum type environment.

Moreover, each of the follower frames 80, 82 includes one or more stage channels for receiving a portion of the device stage 14 and supporting the device stage 14. Referring to FIG. 8A, the first follower frame 80 includes (i) a first front stage channel 118 that extends transversely through the first follower frame 80 near the frame front 98C and the frame bottom 98B, (ii) a first rear stage channel 120 that extends transversely through the first follower frame 80 near the frame rear 98D and the frame bottom 98B, and (iii) a first center stage channel 122 that extends transversely through the first follower frame 80 near the frame bottom 98B between the first front stage channel 118 and the first rear stage channel 120. In this embodiment, each of the first stage channels 118, 120, 122 is generally rectangular shaped. The first front stage channel 118 and the first center stage channel 122 are separated by the first front stiffening strut 124, and the first center stage channel 122 and the first rear stage channel 120 are separated by the first rear stiffening strut 126. Referring back to FIGS. 1 and 3, the first stiffening struts 124, 126 fit through the stage apertures 40 in the device stage 14. Further, the first Y stage bracket 44A and the X stage bracket 46 extends through the first center stage channel 122.

Similarly, the second follower frame 82 includes (i) a second front stage channel 128 that extends transversely through the second follower frame 82 near the frame front 98C and the frame bottom 98B, (ii) a second rear stage channel 130 that extends transversely through the second follower frame 82 near the frame rear 98D and the frame bottom 98B, and (iii) a second center stage channel 132 that extends transversely through the second follower frame 82 between the second front stage channel 128 and the second rear stage channel 130 with clearance for the second Y stage mover 48B. In this embodiment, each of the second stage channels 128, 130, 132 is generally rectangular shaped. The second front stage channel 128 and the second center stage channel 132 are separated by the second front stiffening strut 134, and the second center stage channel 132 and the second rear stage channel 130 are separated by the second rear stiffening strut 136.

Referring back to FIGS. 1 and 3, the second stiffening struts 134, 136 fit through the stage apertures 40 in the device stage 14. Further, the second Y stage bracket 44B extends through the second center stage channel 132.

In this embodiment, (i) a separate stage fluid bearing 137A (illustrated as an arrow in FIGS. 1 and 3) is formed between the top and the bottom of the first front stage channel 118 and the device table 34, (ii) a separate stage fluid bearing 137B (illustrated as an arrow in FIGS. 1 and 3) is formed between the top and bottom of the first rear stage channel 120 and the device table 34, (iii) a separate stage fluid bearing 137C is formed between the top and the bottom of the second front stage channel 128 and the device table 34, and (iv) a separate stage fluid bearing 137D is formed between the top and the bottom of the second rear stage channel 130 and the device stage 34. Stated another way, opposed stage fluid bearings 137A–137D support the device stage 14 away from the follower frames 80, 82 along the Z axis and allow for motion of the device stage 14 relative to the followers frame 80, 82 along the X axis, along the Y axis and about the Z axis. Further, the stiffness can be controlled by controlling the flow of fluid to the opposed stage fluid bearings 137A–137D.

Further, the opposed stage fluid bearings 137A–137D effectively decouple the device stage 14 from vibration of the follower frames 80, 82 along the X axis, along the Y axis and about the Z axis. Moreover, the lines 20 that deliver fluid to the stage fluid bearings 137A–137D are secured to the follower frames 80, 82. This minimizes hose drag and vibration transferred to the device stage 14.

The opposed stage fluid bearings 137A–137D are preferably designed to be vacuum compatible and to minimize fluid that is released to the environment. Suitable fluid bearings are illustrated in FIGS. 9A and 9B and discussed above.

Alternately, the device stage 14 can be supported spaced apart from the follower frames 80, 82 by other planar bearing means. For example, a magnetic type bearing (not shown) or a roller bearing type assembly (not shown) could be utilized. Still alternately, a vacuum preload type fluid bearing can be utilized if the stage assembly 10 is not used in a vacuum type environment.

The first follower mover 84 moves the first follower frame 80 along the Y axis relative to the first follower guide 76 and the mounting base 24 to position the first follower frame 80 to substantially correspond to the movement of the device stage 14 along the Y axis. Similarly, the second follower mover 86 moves the second follower frame 82 along the Y axis relative to the second follower guide 78 and the mounting base 24 to position the second follower frame 82 to substantially correspond to the movement of the device stage 14.

It should be noted that the follower movers 84, 86 have to only approximately track the movement of the device stage 14. It is believed that an error in tracking of as large as one millimeter (1 mm) is acceptable. Such an error would have no impact on the position error of the device stage 14. In the embodiment illustrated in FIG. 11, the exposure apparatus 30 during operation steps along the X axis and scans in the Y axis to cover each reticle 32. This amount of following error allows for the follower movers 84, 86 to be turned off during scanning. Thus, the follower movers 84, 86 will not contribute any time dependent stray magnetic fields that will influence scanning of the reticle.

The design of each of the follower movers 84, 86 can be varied to suit the movement requirements of the stage assembly 10. For example, each of the follower movers 84, 86 can include one or more rotary motors, voice coil motors, linear motors, electromagnetic actuators, or other type of actuators. In the embodiments provided herein, each follower mover 84, 86 includes a follower reaction component 138 and an adjacent follower moving component 140 that interacts with the follower reaction component 138. In the embodiments provided herein, for each of the follower movers 84, 86, one of the follower components 138, 140 includes one or more magnet arrays and the other follower component 138, 140 includes one or more conductor arrays.

Electrical current (not shown) is supplied to the conductors in each conductor array by the control system 22. For the follower movers 84, 86, the electrical current in the conductors interacts with the magnetic field(s) generated by the one or more of the magnets in the magnet array. This causes a force (Lorentz type force) that can be used to move the follower frames 80, 82.

Specifically, the follower reaction component 138 and the follower moving component 140 of each follower mover 84, 86 interact to selectively move each of the follower frames 80, 82 along the Y axis. In the embodiment illustrated herein, each of the follower movers 84, 86 is a commutated, linear motor. The follower reaction component 138 for the first follower mover 84 is secured to the apparatus frame 202 and the mounting base 24 with a first follower reaction frame 142 (illustrated in FIG. 11) and a first follower reaction bracket 143, and the frame moving component 140 of the first frame mover 84 is secured to a first Y mounting bracket 144 and the first follower frame 80. Similarly, the follower reaction component 138 for the second follower mover 86 is secured to the apparatus frame 202 and the mounting base 24 with a second follower reaction frame 146 and a second follower reaction bracket 148, while the follower moving component 140 of the second follower mover 86 is secured to a second Y moving bracket 150 and the second follower frame 82.

In this embodiment, the follower reaction component 138 of each follower mover 84, 86 includes a pair of spaced apart magnet arrays while the follower moving component 140 of each follower mover 84, 86 includes a conductor array. Alternately, for example, the follower movers 84, 86 could be designed so that the follower reaction component 138 includes a conductor array while the follower moving component 140 includes a pair of spaced apart magnet arrays. However, this design is less desirable because of the moving magnetic field.

With this design, the follower movers 84, 86 make relatively large displacement adjustments to the position of the follower frames 80, 82 along the Y axis. The required stroke of the follower movers 84, 86 along the Y axis will vary according to desired use of the stage assembly 10. For an exposure apparatus 30, generally, the stroke of the follower movers 84, 86 is between approximately two hundred and fifty millimeters and nine hundred millimeters.

The stage assembly 10 can include a measurement system (not shown) that monitors movement of the device stage 14 relative to some reference, such as the projection optical assembly 200 (illustrated in FIG. 11). With this information, the stage mover assembly 16 can be used to precisely position of the device stage 14. The design of the measurement system can be varied. Typically, the measurement system monitors the position of the device stage 14 along the X axis, along the Y axis, and about the Z axis. The measurement system, for example, can utilize laser interferometers, encoders, and/or other measuring devices to monitor the position of the device stage 14. In the embodiment illustrated in FIGS. 1–5, the measurement system includes a flat mirror 151 that is integrated into the device table 34 along the second table side 38D, the front table side 38E and/or the rear table side 38F.

The control system 22 controls the stage mover assembly 16 to precisely position the device stage 14 and the device 26. In the embodiment illustrated herein, the control system 22 directs and controls the current to the conductor array for each of the Y stage movers 48A, 48B to control movement of the device stage 14 along the Y axis and about the Z axis. Similarly, the control system 22 directs and controls the current to the conductor array of the X stage mover 50 to control movement of the device stage 14 along the X axis. Further, the control system 22 directs and controls the current to the conductor array of each follower mover 84, 86 to independently control the movement and position of the follower frames 80, 82 to track the movement of the device stage 14 along the Y axis.

FIGS. 10A and 10B illustrate control lines and hoses 20 that extend to the device stage 14. Depending upon the design of the stage assembly 10, the control lines 20 can include electrical cables, fluid supply hose, atmospheric pressure hoses, vacuum hoses and/or coolant hoses.

With the present design, referring to FIG. 10A, one or more table control lines or hose 152 (only one is shown) extends between the device stage 14 and one or both of the follower frames 80, 82 (only one is shown). If a split stage 14 is utilized, a separate table control line 152 can extend between the stage 14 and each of the follower frames 80, 82. Each table control line or hose 152 experiences movement during movement of the device stage 14 relative to the follower frames 80, 82 along the X axis. Further, because the follower frames 80, 82 track the movement of the device stage 14 along the Y axis, each table control line or hose 152 experiences very little movement during movement of the device stage 14 along the Y axis. Thus, the movement of each table control line or hose 152 is substantially one dimensional.

Referring to FIG. 10B, a frame control line or hose 154 extends from the apparatus frame 202 to one of the follower frames 80, 82. The movement of the frame control line or hose 154 is relatively long during movement of the device stage 14 along the Y axis. Further, the movement of the frame control line 154 is essentially one dimensional. Importantly, the lines 154 that extend to the follower frames 80, 82 are decoupled from the device stage 14 along the X axis and the Y axis. Accordingly, these lines 154 connected to the follower frame 80, 82 are unlikely to have a significant influence on the position of the device stage 14.

It should be noted that the follower assembly 18 reduces the number of lines 20 that are secured to the device stage 14 and the length of lines 20 that extend to the device stage 14. This reduces and minimizes the amount of disturbance from the lines 20 that is transferred to the device stage 14. This improves the positioning performance of the stage assembly 10. Further, for an exposure apparatus 30, this allows for more accurate positioning of the reticle 32 relative to the semiconductor wafer 28.

FIG. 11 is a schematic view illustrating an exposure apparatus 30 useful with the present invention. The exposure apparatus 30 includes the apparatus frame 202, an illumination system 204 (irradiation apparatus), a reticle stage assembly 206, the projection optical assembly 200 (lens assembly), a wafer stage assembly 210, a reticle chamber 216, and a wafer chamber 218. The stage assembly 10 illustrated in FIGS. 1–5 is used as the reticle stage assembly 206 in FIG. 11. Alternately, with the disclosure provided herein, the stage assembly 10 illustrated in FIGS. 1–5 can be modified for use as the wafer stage assembly 210. The exposure apparatus 30 mounts to the mounting base 24, e.g., the ground, a base, or floor or some other supporting structure.

The exposure apparatus 30 is particularly useful as a lithographic device that transfers a pattern (not shown) of an integrated circuit from the reticle 32 onto the semiconductor wafer 28. As discussed above, the stage assemblies 10 provided herein are particularly useful in a controlled environment. Thus, the present invention is particularly useful in an exposure apparatus 30 that utilizes an electron or ion beam.

The reticle chamber 216 encloses and encircles the reticle stage assembly 206 and provides the controlled environment around the reticle 32. The design of the reticle chamber 216 can be varied to suit the design requirements of the exposure apparatus 30. The reticle chamber 216 illustrated in FIG. 11 is generally rectangular shaped and defines a generally rectangular shaped chamber cavity.

Similarly, the wafer chamber 218 encloses and encircles the wafer 28 and provides the controlled environment around the wafer 28 and wafer stage assembly 210. The wafer chamber 218 illustrated in FIG. 11 is generally rectangular shaped.

The desired environment in each chamber 216, 218 varies accordingly to the type of exposure apparatus. For example, for an exposure apparatus 30, the desired controlled environment can be an inert gas such as Argon, Helium, or Nitrogen. Alternately, for example, the controlled environment can be a vacuum, some other fluid or some other environment.

The apparatus frame 202 is rigid and supports the components of the exposure apparatus 30. The design of the apparatus frame 202 can be varied to suit the design requirements for the rest of the exposure apparatus 30. The apparatus frame 202 illustrated in FIG. 11 supports the projection optical assembly 200 and the illumination system 204 and the reticle stage assembly 206 above the mounting base 24.

The illumination system 200 includes an illumination source 212 and an illumination optical assembly 214. The illumination source 212 emits a beam of light or charged particles such as electrons. The illumination optical assembly 214 guides the beam from the illumination source 212 to the projection optical assembly 200. The beam illuminates selectively different portions of the reticle 26 and exposes the semiconductor wafer 28.

The projection optical assembly 200 projects and/or focuses the light or electron beam passing through the reticle to the wafer. Depending upon the design of the exposure apparatus 30, the projection optical assembly 200 can magnify or reduce the image illuminated on the reticle. The above description of the exposure apparatus 30 has been general, as far as the nature of the irradiation used to expose wafers is concerned. The present invention is likely to be most useful when the irradiation consists of charged particles, such as electrons or ions. In that case the wafer chamber 216 and reticle chamber 218 are vacuum chambers that are attached to the illumination optical assembly 214 and the projection optical assembly 200 by hermetic seals. However, even in a photolithography system, where the irradiation consists of photons of any wavelength, the present invention may be applied with profit to this system as well.

The reticle stage assembly 206 holds and positions the reticle relative to the projection optical assembly 200 and the wafer. Similarly, the wafer stage assembly 210 holds and positions the wafer with respect to the projected image of the illuminated portions of the reticle in the operational area. Depending upon the design, the exposure apparatus 30 can also include additional motors to move the stage assemblies 206, 210.

There are a number of different types of lithographic devices. For example, the exposure apparatus 30 can be used as a scanning type photolithography system that exposes the pattern from the reticle onto the wafer with the reticle and the wafer moving synchronously. In a scanning type lithographic device, the reticle is moved perpendicular to an optical axis of the projection optical assembly 200 by the reticle stage assembly 206 and the wafer is moved perpendicular to an optical axis of the projection optical assembly 200 by the wafer stage assembly 210. Illumination of the reticle and exposure of the wafer occurs while the reticle and the wafer are moving synchronously.

Alternately, the exposure apparatus 30 can be a step-and-repeat type photolithography system that exposes the reticle while the reticle and the wafer are stationary. In the step and repeat process, the wafer is in a constant position relative to the reticle and the projection optical assembly 200 during the exposure of an individual field. Subsequently, between consecutive exposure steps, the wafer is consecutively moved by the wafer stage perpendicular to the optical axis of the projection optical assembly 200 so that the next field of the wafer is brought into position relative to the projection optical assembly 200 and the reticle for exposure. Following this process, the images on the reticle are sequentially exposed onto the fields of the wafer so that the next field of the wafer is brought into position relative to the projection optical assembly 200 and the reticle.

However, the use of the exposure apparatus 30 and the stage assembly 10 provided herein are not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, measurement machines, and inspection machines.

Figure 12A:
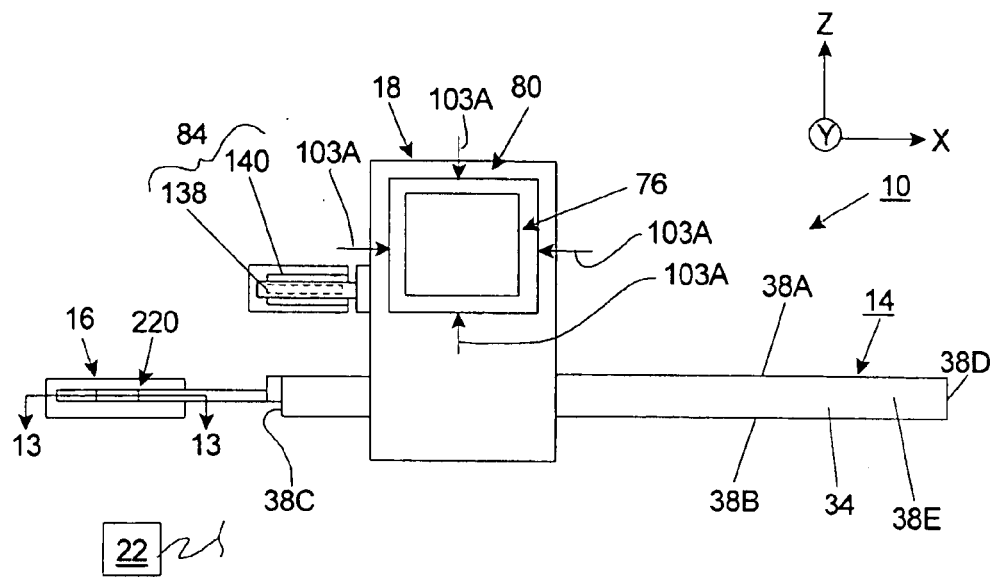
FIG. 12A is a side plan view of a second embodiment of a stage assembly having features of the present invention.
Figure 12B:
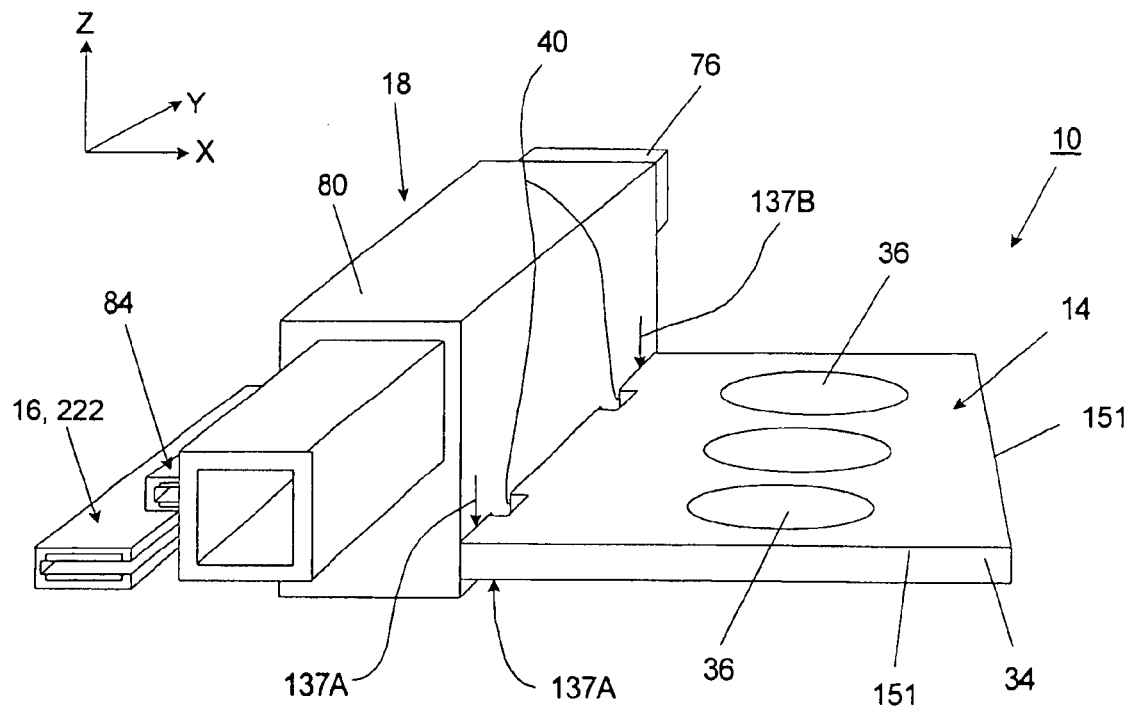
FIG. 12B is a perspective view of the stage assembly of FIG. 12A.

FIGS. 12A and 12B illustrate a second embodiment of a stage assembly 10 having features of the present invention. In this embodiment, stage assembly 10 again includes the device stage 14, the stage mover assembly 16, the follower assembly 18 and the control system 22. However, in this embodiment, the stage mover assembly 16 and the follower assembly 18 are somewhat different from the equivalent components described above.

Figure 13:
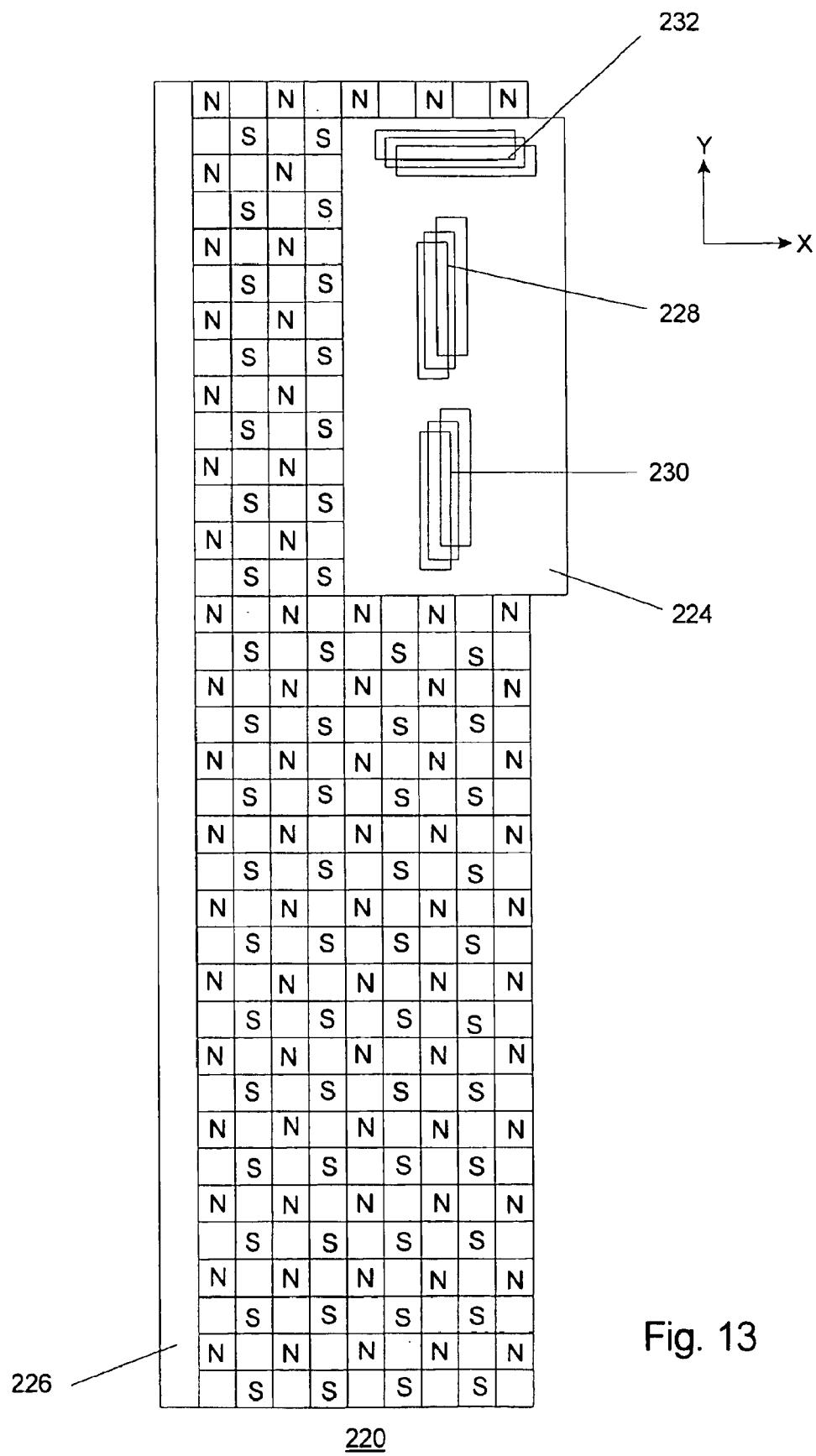
FIG. 13 is a cut-away view taken on line 13—13 of FIG. 12A.

More specifically, in this embodiment, the stage mover assembly 16 includes a single XY mover 220 that moves the device stage 14 along the X axis, along the Y axis and about the Z axis. FIG. 13 illustrates a cutaway view of a XY mover 220 that can be used to move the device stage 14 along the X axis, along the Y axis and about the Z axis. In this embodiment, the XY mover 220 includes a XY reaction component 222 and an adjacent XY moving component 224 that interacts with the XY reaction component 222. The XY reaction component 222 includes an upper magnet array and a spaced apart lower magnet that are secured to a XY bracket 226. Further, upper magnet array and the lower magnet array define a XY magnet gap. In this embodiment, each of the magnet arrays includes both north and south poles distributed in both longitudinal and latitudinal directions along the plane of each magnet array. Stated another way, in each magnet array, the magnets are periodically distributed in the longitudinal and latitudinal direction with an alternating pattern of north and south poles along diagonals of each magnet array. Further, the polarities of adjacent magnets in the magnet arrays are opposite.

The XY moving component 224 includes a first X conductor 228, a second X conductor 230 and a Y conductor 232. When electrically excited, (i) the first X conductor 228 and the second X conductor 230 cooperate to move the XY moving component 224 along the X axis and about the Z axis, and (ii) the Y conductor 232 moves the XY moving component 224 along the Y axis. A more complete discussion of this type of motor is provided in U.S. Pat. No. 6,127,749. As far as permitted, the disclosure of U.S. Pat. No. 6,127,749, is incorporated herein by reference.

The follower assembly 18 again supports the device stage 14 and allows for the use of a relatively thin device stage 14. Further, the follower assembly 18 reduces the number of control cables and hoses 20 that are secured to the device stage 14 and the length of stage lines 20 that extend to the device stage 14. This reduces and minimizes the amount of disturbance from the stage lines 20 that is transferred to the device stage 14.

In the embodiment illustrated in FIGS. 12A and 12B, the follower assembly 18 includes only the first follower guide 76, the first follower frame 80, and the first follower mover 84. In this design, the device stage 14 cantilevers away from and is supported by the first follower frame 80. The first follower guide 76, the first follower frame 80 and the first follower mover 84 are somewhat similar to the equivalent components described above and illustrated in FIGS. 1–5. In the embodiment illustrated in FIGS. 12A and 12B, the device stage 14 may be made thinner and lighter as a result of this design.

Figure 14:
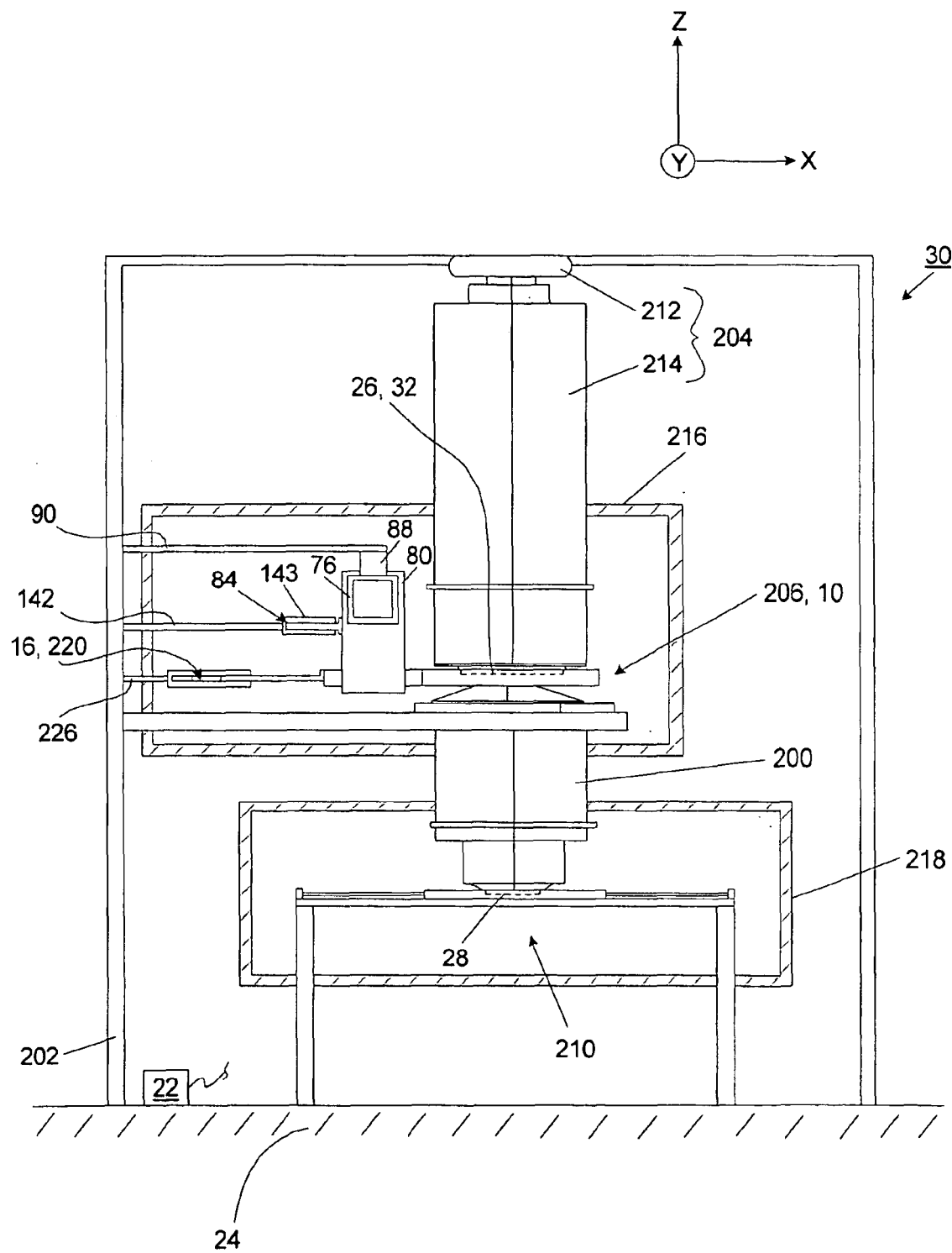
FIG. 14 is a side illustration of another embodiment of an exposure apparatus having features of the present invention.
Figure 15:
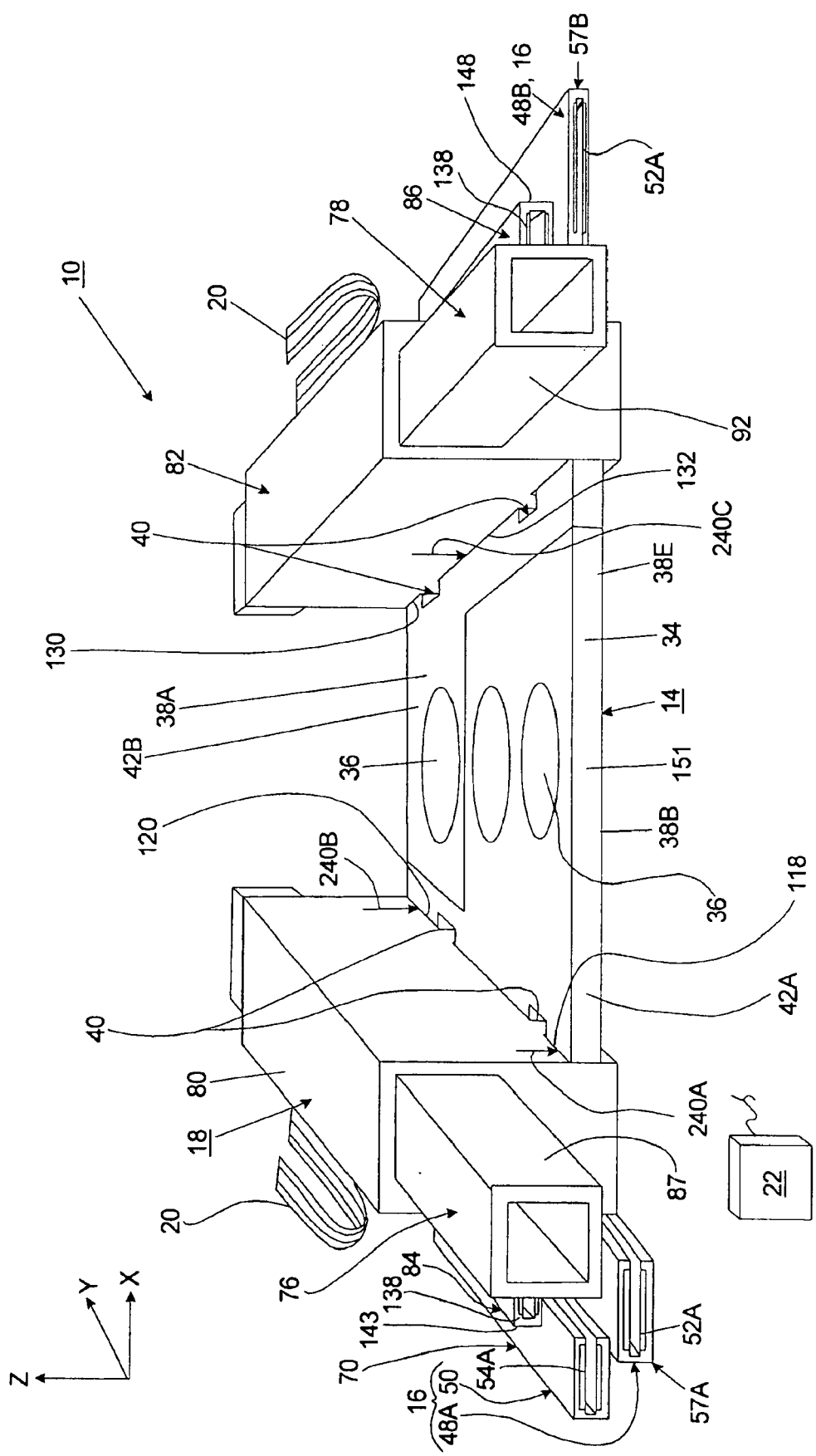
FIG. 15 illustrates a top perspective view of another embodiment of a stage assembly having features of the present invention.
Figure 16:
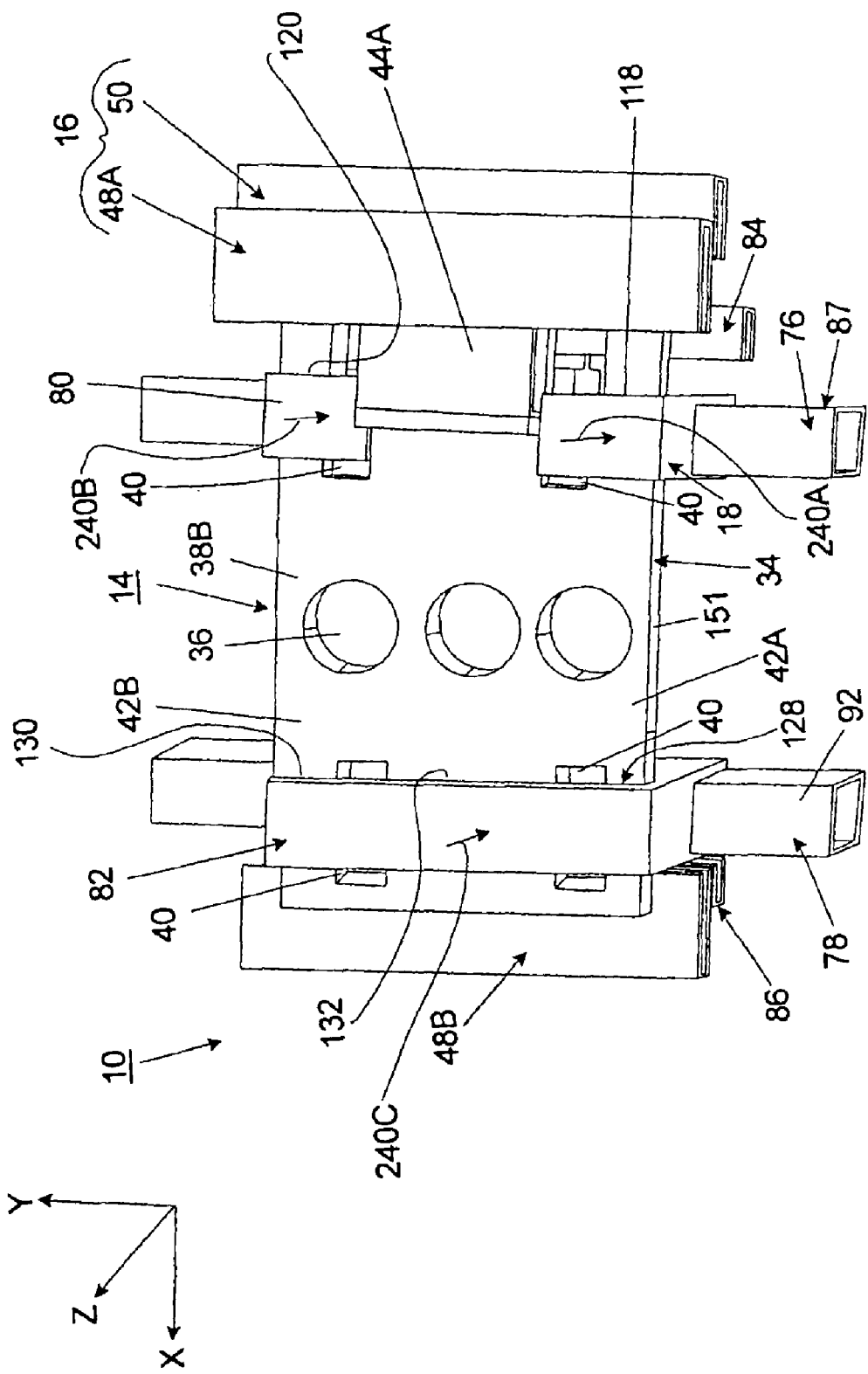
FIG. 16 is a bottom perspective view of the stage assembly of FIG. 15.

FIG. 14 is a schematic view illustrating another exposure apparatus 30 useful with the present invention. The exposure apparatus 30 includes the apparatus frame 202, the illumination system 204 (irradiation apparatus), the reticle stage assembly 206, the projection optical assembly 200 (lens assembly), the wafer stage assembly 210, the reticle chamber 216, and the wafer chamber 218. The stage assembly 10 illustrated in FIGS. 12A and 12B is used as the reticle stage assembly 206 in FIG. 14. Alternately, with the disclosure provided herein, the stage assembly 10 illustrated in FIGS. 12A and 12B can be modified for use as the wafer stage assembly 210.

FIGS. 15–17B illustrate yet another embodiment of a stage assembly 10 having features of the present invention. In this embodiment, the stage assembly 10 again includes the device stage 14, the stage mover assembly 16, the follower assembly 18 and the control system 22. This embodiment is somewhat similar to the design illustrated in FIGS. 1–5 and described above. However, in this embodiment, the device stage 14 is supported in a kinematic manner relative to the follower frames 80, 82 to minimize deformation of the device stage 14.

In FIGS. 15–17B, the first follower frame 80 and the second follower frame 82 cooperate to support the device stage 14 and allow for motion of the device stage 14 along the X axis, along the Y axis and about the Z axis. Moreover, the follower frames 80, 82 cooperate to support device stage 14 near the first table side 38C and the second table side 38D. Further, the follower frames 80, 82 eliminate the need to attach fluid lines for fluid bearings to the device stage 14. Moreover, the follower frames 80, 82 support the stage cables 20 near the device stage 14.

In this embodiment, three opposed pairs of stage fluid bearings 240A–240C are used to effectively support the device table 34 a three spaced apart locations, e.g. a kinematice manner. More specifically, (i) a separate stage fluid bearing 240A (illustrated as an arrow in FIGS. 15 and 16) is formed between the top and the bottom of the first front stage channel 118 and the device table 34, (ii) a separate stage fluid bearing 240B is formed between the top and the bottom of the first rear stage channel 120 and the device table 34, and (iii) a separate stage fluid bearing 240C is formed between the top and the bottom of the second center stage channel 132 and the device stage 34. Stated another way, opposed stage fluid bearings 240A–240C support the device stage 14 away from the follower frames 80, 82 along the Z axis and allow for motion of the device stage 14 relative to the followers frame 80, 82 along the X axis, along the Y axis and about the Z axis. Further, the stiffness can be controlled by controlling the flow of fluid to the opposed stage fluid bearings 240A–240C.

Figure 17A:
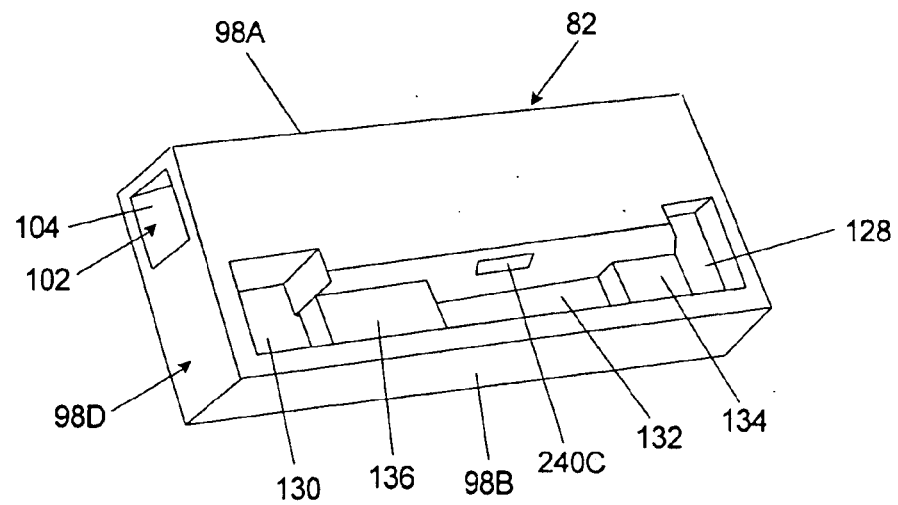
FIG. 17A is a perspective view of a second follower frame having features of the present invention.
Figure 17B:
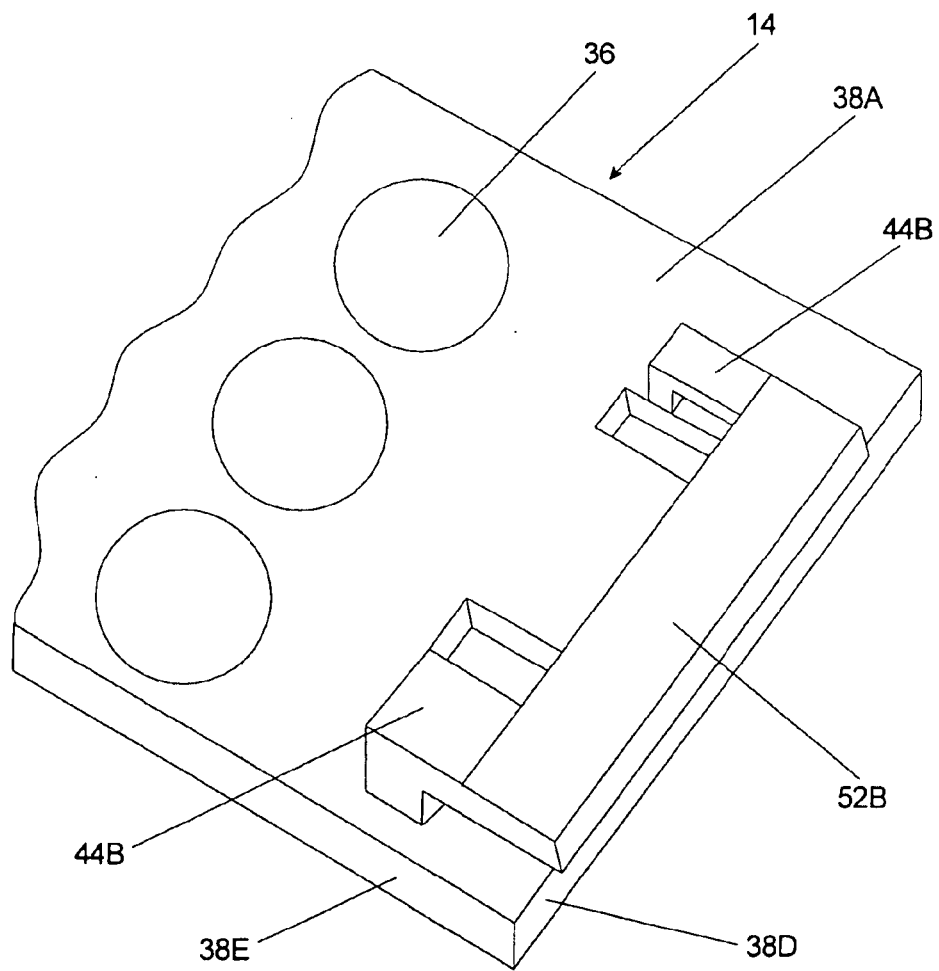
FIG. 17B is a perspective view of a portion of a device stage having features of the present invention.

It should be noted, referring to FIGS. 17A and 17B that the second center stage channel 132 of the second follower frame 82 is smaller than in the embodiment illustrated in FIGS. 1–5 to accommodate the stage fluid bearing 240C between the second follower frame 82 and the device stage 14. Further, the second front stage channel 128 and the second rear stage channel 130 are larger than in the embodiment illustrated in FIGS. 1–5 to accommodate the first Y stage bracket 44A and the second Y stage bracket 44B respectively.

While the particular stage assembly 10 and exposure apparatus 30 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device along a Y axis, the stage assembly comprising:
   a device stage that retains the device;
   a stage mover assembly connected to the device stage, the stage mover assembly moving the device stage along the Y axis, the stage mover assembly generating a reaction force that is transferred to a reaction component; and
   a first follower frame that constrains motion of the device stage along a Z axis that is orthogonal to the Y axis, the first follower frame being moved substantially concurrently with and to substantially follow the movement of the device stage along the Y axis; wherein the reaction component is not directly connected to the first follower frame.

2. The stage assembly of claim 1 wherein the stage mover assembly moves the device stage along an X axis relative to the first follower frame.

3. The stage assembly of claim 1 further comprising a first follower mover that moves the first follower frame along the Y axis.

4. The stage assembly of claim 3 wherein the first follower mover moves the first follower frame along the Y axis substantially concurrently as the stage mover assembly moves the device stage along the Y axis.

5. The stage assembly of claim 3 wherein the first follower mover does not direct a force that acts on the device stage.

6. The stage assembly of claim 1 wherein the first follower frame includes a stage channel for receiving a portion of the device stage and a pair of opposed stage fluid bearings that support the device stage relative to the stage channel and allow device stage to move along an X axis relative to the first follower frame.

7. The stage assembly of claim 1 further comprising a first follower guide that supports the first follower frame.

8. The stage assembly of claim 7 further comprising a first pair of opposed, guide fluid bearings and a second pair of opposed, guide fluid bearings that support the first follower frame relative to the first follower guide along an X axis and along the Z axis and allow for movement of the first follower frame relative to the first follower guide along the Y axis.

9. The stage assembly of claim 1 wherein the first follower frame supports the device stage near a first table side of the device stage.

10. The stage assembly of claim 1 further comprising a second follower frame that supports the device stage along the Z axis, the second follower frame moving along the Y axis.

11. The stage assembly of claim 10 wherein the first follower frame and the second follower frame are moved substantially concurrently with the device stage along the Y axis.

12. The stage assembly of claim 10 wherein the first follower frame supports the device stage near a first table side of the device stage and the second follower frame supports the device stage near a second table side of the device stage.

13. The stage assembly of claim 12 wherein the stage mover assembly includes a first Y stage mover and a second Y stage mover and the follower frames are positioned between the first Y stage mover and the second Y stage mover.

14. The stage assembly of claim 10 wherein the first follower frame and the second follower frame support the device stage in a kinematic manner.

15. The stage assembly of claim 1 wherein the device stage includes a first table section and a second table section that is movable relative to the first table section to separate the device stage.

16. The stage assembly of claim 15 wherein each of the table sections retains at least one device.

17. The stage assembly of claim 1 further comprising a line that is connected to the device stage, the line being secured to the first follower frame.

18. The stage assembly of claim 17 wherein the line provides fluid to the device stage.

19. The stage assembly of claim 17 where the line carries electrical current.

20. An exposure apparatus including the stage assembly of claim 1.

21. A device manufactured with the exposure apparatus according to claim 20.

22. A wafer on which an image has been formed by the exposure apparatus of claim 20.

23. The stage assembly of claim 1 wherein the stage mover assembly does not direct a force that acts on the first follower frame.

24. The stage assembly of claim 1 further comprising a stage fluid bearing that supports the device stage relative to the first follower frame.

25. The stage assembly of claim 1 further comprising a pair of opposed stage fluid bearings that support the device stage relative to the first follower frame.

26. A stage assembly that moves a device along an X axis and a Y axis, the stage assembly comprising:
a device stage that retains the device;
a stage mover assembly connected to the device stage, the stage mover assembly moving the device stage along the X axis and along the Y axis, the stage mover assembly generating a reaction force that is transferred to a reaction component;
a first follower frame that supports the device stage along a Z axis; wherein the reaction component is not directly connected to the first follower frame; and
a first follower mover that moves the first follower frame along the Y axis substantially concurrently with the movement of the device stage by the stage mover assembly along the Y axis.

27. The stage assembly of claim 26 further comprising a pair of opposed stage fluid bearings that support the device stage relative to the first follower frame and allow device stage to move along the X axis and along the Y axis relative to the first follower frame.

28. The stage assembly of claim 26 further comprising a first follower guide, a first pair of opposed, guide fluid bearings and a second pair of opposed, guide fluid bearings that support the first follower frame relative to the first follower guide along the X axis and the Z axis and allow for movement of the first follower frame relative to the first follower guide along the Y axis.

29. The stage assembly of claim 26 further comprising a second follower frame that supports the device stage along the Z axis, and a second follower mover that moves the second follower frame substantially concurrently with the device stage along the Y axis.

30. The stage assembly of 29 wherein the first follower frame supports the device stage near a first table side of the device stage and the second follower frame supports the device stage near a second table side of the device stage.

31. The stage assembly of claim 29 wherein the first follower frame and the second follower frame support the device stage in a kinematic manner.

32. The stage assembly of claim 26 wherein the device stage includes a first table section and a second table section that is movable relative to the first table section to separate the device stage.

33. The stage assembly of claim 32 wherein each of the table sections retains at least one device.

34. The stage assembly of claim 26 further comprising a line that is connected to the device stage, the line being secured to the first follower frame.

35. The stage assembly of claim 34 wherein the line provides fluid to the device stage.

36. The stage assembly of claim 34 where the line carries electrical current.

37. An exposure apparatus including the stage assembly of claim 26.

38. A device manufactured with the exposure apparatus according to claim 37.

39. A wafer on which an image has been formed by the exposure apparatus of claim 37.

40. The stage assembly of claim 26 wherein the first follower mover moves the first follower frame along the Y axis to substantially track the movement of the device stage by the stage mover assembly along the Y axis.

41. The stage assembly of claim 26 wherein the first follower mover does not direct a force that acts on the device stage.

42. The stage assembly of claim 26 wherein the stage mover assembly does not direct a force that acts on the first follower frame.

43. The stage assembly of claim 26 further comprising a stage fluid bearing that supports the device stage relative to the first follower frame.

44. The stage assembly of claim 26 further comprising a pair of opposed stage fluid bearings that support the device stage relative to the first follower frame.

45. A method for making a stage assembly that moves a device along a Y axis, the method comprising the steps of:
   providing a device stage that retains the device;
   connecting a stage mover assembly to the device stage, the stage mover assembly moving the device stage along the Y axis, the stage mover assembly generating a reaction force that is transferred to a reaction component;
   inhibiting motion of the device stage along a Z axis with a first follower frame; wherein the reaction component is not directly connected to the first follower frame; and
   connecting a first follower mover to the first follower frame, the first follower mover moving the first follower frame substantially concurrently with the movement of the device stage by the stage mover assembly along the Y axis.

46. The method of claim 45 wherein the step of inhibiting motion of the device stage includes the step of providing a pair of opposed stage fluid bearings that support the device stage relative to the first follower frame and allow the device stage to move along an X axis relative to the first follower frame.

47. The method of claim 45 wherein the step of inhibiting motion of the device stage includes the step of providing a first follower guide, a first pair of opposed, guide fluid bearings and a second pair of opposed, guide fluid bearings, the guide fluid bearings supporting the first follower frame relative to the first follower guide along an X axis and the Z axis and allowing for movement of the first follower frame relative to the first follower guide along the Y axis.

48. The method of claim 45 wherein the step of inhibiting motion of the device stage includes the step of supporting the device stage near a first table side of the device stage with the first follower frame.

49. The method of claim 45 further comprising the step of supporting the device stage along the Z axis with a second follower frame.

50. The method of claim 49 further comprising the step of connecting a second follower mover to the second follower frame, the second follower mover moving the second follower frame substantially concurrently with the device stage along the Y axis.

51. The method of claim 49 wherein the first follower frame supports the device stage near a first table side of the device stage and the second follower frame supports the device stage near a second table side of the device stage.

52. The method of claim 49 wherein the first follower frame and the second follower frame support the device stage in a kinematic manner.

53. The method of claim 45 wherein the step of providing a device stage includes the step of providing a first table section and a second table section that is movable relative to the first table section to separate the device stage.

54. The method of claim 53 further comprising the steps of retaining a first device with the first table section and retaining a second device with the second table section.

55. The method of claim 45 further comprising the step of connecting a line from the first follower frame to the device stage.

56. The method of claim 55 wherein the step of connecting a line includes the step of the line providing fluid to the device table.

57. The method of claim 55 where the step of connecting a line includes the step of the line carries electrical current.

58. A method for making an exposure apparatus that forms an image on a wafer, the method comprising the steps of:
   providing an irradiation apparatus that irradiates the wafer with radiation to form the image on the wafer; and
   providing the stage assembly made by the method of claim 45.

59. A method of making a wafer utilizing the exposure apparatus made by the method of claim 58.

60. A method of making a device including at least the exposure process: wherein the exposure process utilizes the exposure apparatus made by the method of claim 58.

61. The method of claim 45 wherein the first follower mover moves the first follower frame along the Y axis to substantially track the movement of the device stage by the stage mover assembly along the Y axis.

62. The method of claim 45 wherein the first follower mover does not direct a force that acts on the device stage.

63. The method of claim 45 wherein the stage mover assembly does not direct a force that acts on the first follower frame.

64. A stage assembly that moves a device, the stage assembly comprising:
   a device stage that retains the device;
   a stage mover assembly connected to the device stage, the stage mover assembly moving the device stage along an axis, the stage mover assembly generating a reaction force that is transferred to a reaction component;
   a frame that supports the device stage; wherein the reaction component is not directly connected to the frame; and
   a mover connected to the frame, wherein the mover moves the frame along the axis at substantially the same time that the stage mover assembly moves the device stage along the axis.

65. The stage assembly of claim 64 wherein the mover moves the frame along the axis to substantially track the movement of the device stage by the stage mover assembly along the axis.

66. The stage assembly of claim 64 wherein the mover does not direct a force that acts on the device stage.

67. The stage assembly of claim 64 wherein the stage mover assembly does not direct a force that acts on the frame.

68. An exposure apparatus including the stage assembly of claim 64.

69. The stage assembly of claim 64 further comprising a stage fluid bearing that supports the device stage relative to the frame.

70. The stage assembly of claim 64 further comprising a pair of opposed stage fluid bearings that support the device stage relative to the frame.

71. A stage assembly that moves a device, the stage assembly comprising:
   a device stage that retains the device;
   a stage mover assembly connected to the device stage, the stage mover assembly moving the device stage along a first axis, the stage mover assembly generating a reaction force that is transferred to a reaction component;
   a frame that inhibits motion of the device stage along a second axis; wherein the reaction component is not directly connected to the frame; and
   a mover connected to the frame, wherein the mover moves the frame along the first axis and wherein the mover does not direct a force that acts on the device stage.

72. The stage assembly of claim 71 wherein the stage mover assembly does not direct a force that acts on the frame.

73. An exposure apparatus including the stage assembly of claim 71.

74. The stage assembly of claim 71 further comprising a stage fluid bearing that supports the device stage relative to the frame.

75. The stage assembly of claim 71 further comprising a pair of opposed stage fluid bearings that support the device stage relative to the frame.

* * * * *